(12) United States Patent
Masubuchi et al.

(10) Patent No.: US 9,231,189 B2
(45) Date of Patent: Jan. 5, 2016

(54) SODIUM NIOBATE POWDER, METHOD FOR PRODUCING THE SAME, METHOD FOR PRODUCING CERAMIC, AND PIEZOELECTRIC ELEMENT

(71) Applicant: CANON KABUSHIKI KAISHA, Tokyo (JP)

(72) Inventors: Tomoaki Masubuchi, Yokosuka (JP); Toshiaki Aiba, Fujisawa (JP); Toshihiro Ifuku, Yokohama (JP); Makoto Kubota, Yokohama (JP); Takayuki Watanabe, Yokohama (JP); Tatsuo Furuta, Machida (JP); Jumpei Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/394,494

(22) PCT Filed: Apr. 3, 2013

(86) PCT No.: PCT/JP2013/060764
§ 371 (c)(1),
(2) Date: Oct. 15, 2014

(87) PCT Pub. No.: WO2013/157452
PCT Pub. Date: Oct. 24, 2013

(65) Prior Publication Data
US 2015/0062257 A1 Mar. 5, 2015

(30) Foreign Application Priority Data

Apr. 16, 2012 (JP) .................................. 2012-093069

(51) Int. Cl.
*H01L 41/187* (2006.01)
*B32B 18/00* (2006.01)
(Continued)

(52) U.S. Cl.
CPC ............ *H01L 41/1873* (2013.01); *B32B 18/00* (2013.01); *B41J 2/14274* (2013.01);
(Continued)

(58) Field of Classification Search
None
See application file for complete search history.

(56) References Cited

U.S. PATENT DOCUMENTS 5,376,590 A * 12/1994 Machida et al. .............. 438/763
2003/0202114 A1 * 10/2003 Takizawa et al. ............. 348/335
(Continued)

FOREIGN PATENT DOCUMENTS

| CN | 102369162 A | 3/2012 |
|---|---|---|
| EP | 1808908 A2 | 7/2007 |

(Continued)

OTHER PUBLICATIONS

Ji, L, et al., "Polymorphology of sodium niobate based on two different bidentate organics", Materials Research Bulletin, 2010, pp. 314-317, vol. 45.

(Continued)

*Primary Examiner* — Erica Lin
(74) *Attorney, Agent, or Firm* — Canon USA Inc. IP Division

(57) ABSTRACT

A sodium niobate powder includes sodium niobate particles having a shape of a cuboid and having a side average length of 0.1 μm or more and 100 μm or less, wherein at least one face of each of the sodium niobate particles is a (100) plane in the pseudocubic notation and a moisture content of the sodium niobate powder is 0.15 mass % or less. A method for producing a ceramic using the sodium niobate powder is provided. A method for producing a sodium niobate powder includes a step of holding an aqueous alkali dispersion liquid containing a niobium component and a sodium component at a pressure exceeding 0.1 MPa, a step of isolating a solid matter from the aqueous dispersion liquid after the holding, and a step of heat treating the solid matter at 500° C. to 700° C.

28 Claims, 17 Drawing Sheets

(51) Int. Cl.
*C01G 33/00* (2006.01)
*C04B 35/495* (2006.01)
*H01G 4/12* (2006.01)
*B41J 2/14* (2006.01)
*C04B 35/64* (2006.01)
*G02B 27/00* (2006.01)
*H01L 41/047* (2006.01)
*H01L 41/083* (2006.01)
*H02N 2/12* (2006.01)
*H02N 2/10* (2006.01)

(52) U.S. Cl.
CPC .............. *C01G 33/00* (2013.01); *C04B 35/495* (2013.01); *C04B 35/64* (2013.01); *G02B 27/0006* (2013.01); *H01G 4/1254* (2013.01); *H01L 41/0477* (2013.01); *H01L 41/083* (2013.01); *H02N 2/103* (2013.01); *H02N 2/12* (2013.01); *C01P 2004/38* (2013.01); *C01P 2004/62* (2013.01); *C01P 2006/82* (2013.01); *C04B 2235/3201* (2013.01); *C04B 2235/3236* (2013.01); *C04B 2235/3255* (2013.01); *C04B 2235/52* (2013.01); *C04B 2235/5292* (2013.01); *C04B 2235/5296* (2013.01); *C04B 2235/5436* (2013.01); *C04B 2235/5445* (2013.01); *C04B 2235/768* (2013.01); *C04B 2235/787* (2013.01); *C04B 2237/34* (2013.01); *C04B 2237/405* (2013.01); *C04B 2237/407* (2013.01); *H02N 2/106* (2013.01)

(56) References Cited

U.S. PATENT DOCUMENTS

2005/0248625 A1* 11/2005 Matsumoto et al. ............ 347/68
2010/0327703 A1* 12/2010 Uetani et al. .................. 310/364
2012/0064344 A1* 3/2012 Muramatsu et al. .......... 428/402

FOREIGN PATENT DOCUMENTS

| EP | 2418174 A1 | 2/2012 |
| JP | 2010-241658 A | 10/2010 |
| WO | WO 2010116972 A1 * | 10/2010 |
| WO | 2011/065367 A1 | 6/2011 |
| WO | 2012/165267 A1 | 12/2012 |

OTHER PUBLICATIONS

O'Callaghan, S.A., et al., "Synthesis and processing of nanosized sodium potassium niobate powders", Material Science and Technology, 2009, pp. 1302-1306, vol. 25. No. 11.

* cited by examiner

SODIUM NIOBATE POWDER, METHOD FOR PRODUCING THE SAME, METHOD FOR PRODUCING CERAMIC, AND PIEZOELECTRIC ELEMENT

TECHNICAL FIELD

The present invention relates to a sodium niobate powder having a shape of a cuboid and a low moisture content and a method for producing the sodium niobate powder. The present invention also relates to a method for producing a ceramic using the sodium niobate powder having a shape of a cuboid and a piezoelectric element.

BACKGROUND ART

Piezoelectric ceramics are generally composed of an $ABO_3$ perovskite-type metal oxide such as lead zirconate titanate (hereinafter referred to as "PZT"). However, since PZT contains lead as an A-site element, the effect of PZT on environment is regarded as a problem. Therefore, piezoelectric ceramics composed of a lead-free perovskite-type metal oxide have been required.

An example of the piezoelectric ceramics composed of a lead-free perovskite-type metal oxide is an alkali niobate compound (general formula: $MNbO_3$, M is an alkali metal). Perovskite-type metal oxides containing sodium niobate, such as a solid solution of sodium niobate and barium titanate or a solid solution of sodium niobate and potassium niobate, are promising as alternative compounds for PZT. Such an alkali niobate compound has an advantage in that sintering can be performed at a low temperature of, for example, 1300° C. or less.

A metal oxide powder serving as a raw material for obtaining a piezoelectric ceramic from the alkali niobate compound is generally produced by a so-called solid state reaction including a step of mechanically mixing or kneading each metal oxide, a step of molding the mixture into a pellet, and a step of firing the pellet.

In recent years, a synthesis method in a liquid phase has also been considered. For example, PTL 1 discloses a synthesis method that uses a solvothermal process. This synthesis method provides alkali niobate particles that have a shape of a cuboid and a uniform size and are suitable for piezoelectric ceramics.

CITATION LIST

Patent Literature

PTL 1 Japanese Patent Laid-Open No. 2010-241658

SUMMARY OF INVENTION

Technical Problem

However, the synthesis method in a liquid phase poses a problem in that sodium niobate particles include an intralattice hydroxyl group (constitution water) because sodium niobate particles grow in an aqueous alkali solution while taking in a hydroxyl group.

On the other hand, sodium niobate particles synthesized by solid state reaction do not include constitution water. However, an extremely large number of pores are present in the surfaces of the particles synthesized by solid state reaction, which poses a problem in that moisture adsorbs to the pores (physically adsorbed water) upon the exposure to the air.

The constitution water is bonded to the sodium niobate particles with an extremely strong chemical bond. Therefore, the constitution water cannot be removed by a typical drying process (about 80° C. to 200° C.). The physically adsorbed water has a reversible property in which the physically adsorbed water can be desorbed once by a typical drying process, but adsorbs again by short-time exposure to the air.

The constitution water and physically adsorbed water pose a problem in that the quality of ceramics and devices is degraded in a ceramic production process. Examples of the problem include the formation of pores and the oxidation of a Ni internal electrode.

In view of the foregoing, the present invention provides a sodium niobate powder having a low moisture content, a method for producing the sodium niobate powder, and a method for producing a ceramic using the sodium niobate powder.

Solution to Problem

According to a first aspect of the present invention, a sodium niobate powder includes sodium niobate particles having a shape of a cuboid and having a side average length of 0.1 μm or more and 100 μm or less, wherein at least one face of each of the sodium niobate particles is a (100) plane in the pseudocubic notation, and a moisture content of the sodium niobate powder is 0.15 mass % or less.

According to a second aspect of the present invention, a method for producing a sodium niobate powder at least includes a step of holding an aqueous alkali dispersion liquid containing at least a niobium component and a sodium component at a pressure exceeding 0.1 MPa, a step of isolating a solid matter from the aqueous dispersion liquid after the holding, and a step of heat treating the solid matter at 500° C. or more and 700° C. or less.

According to a third aspect of the present invention, a method for producing a ceramic includes a step of obtaining a compact by molding a raw material powder containing the sodium niobate powder and a step of firing the compact.

Advantageous Effects of Invention

According to the present invention, a sodium niobate powder having a low moisture content can be provided. Furthermore, a high-quality ceramic can be produced without being affected by moisture.

Further features of the present invention will become apparent from the following description of exemplary embodiments with reference to the attached drawings.

DESCRIPTION OF EMBODIMENTS

Figure 1A:
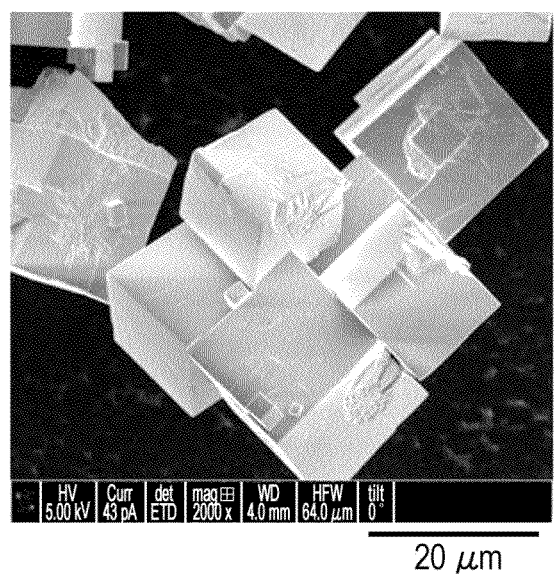
FIG. 1A is a scanning electron microscope photograph showing a sodium niobate powder having a shape of a cuboid and used in Examples 1 to 6 of the present invention.

Embodiments of the present invention will now be described.

The present invention provides a sodium niobate powder, a method for producing the sodium niobate powder, and a method for producing a ceramic. A ceramic produced in the present invention can be used as a piezoelectric material for various applications such as capacitors, memories, and sensors by utilizing its properties as a dielectric.

(1) Sodium Niobate Powder

The sodium niobate powder of the present invention contains sodium niobate particles having a shape of a cuboid and having a side average length of 0.1 μm or more and 100 μm or less. At least one face of each of the sodium niobate particles is a (100) plane in the pseudocubic notation. The moisture content of the sodium niobate powder is 0.15 mass % or less.

In the present invention, the terms "cuboid" or "cuboidal" refer to a parallelepiped shape in which an angle formed by faces falls within 90°±10°. The cuboid also encompasses a cubic shape. In addition, the cuboid also encompasses a partially defected cuboid and a cuboid having an irregular portion on any one of six faces. The NN particle is cuboidal, and hence the orientation of the cuboidal particle can be controlled by using it in a doctor blade method, applying vibration to the particle, or pressing the particle on a substrate. The average side length is an average of lengths of three sides which are unparallel with one another among 12 sides of one cuboidal particle. The NN powder containing an NN particle refers to an NN powder containing a large number of the NN particles of the present invention. The side average length of the sodium niobate particles having a shape of a cuboid is 0.1 μm or more and 100 μm or less, preferably 1 μm or more and 50 μm or less, and more preferably 5 μm or more and 20 μm or less.

When the side average length of the sodium niobate particles having a shape of a cuboid is less than 0.1 μm, it is difficult to perform orientation control by a doctor blade method. The difficulty in orientation control means that the Lotgering factor F that relatively indicates the degree of orientation of ceramics obtained by various kinds of orientation control is not more than 10%.

The Lotgering factor F is calculated from Equation 2 using the peak intensity of X-rays diffracted by the target crystal plane.

$$F=(\rho-\rho_0)/(1-\rho_0) \quad \text{(Equation 2)}$$

In Equation 2, $\rho_0$ is calculated using the X-ray diffraction intensity ($I_0$) of a randomly-oriented sample. In the case of a tetragonal crystal having a (001) orientation, $\rho_0$ is calculated from Equation 3 as the ratio of the total of the diffraction intensities of the (001) plane to the total diffraction intensity.

$$\rho_0 = \Sigma I_0(001)/\Sigma I_0(hkl) \quad \text{(Equation 3)}$$

(h, k, and l are each an integer)

In Equation 2, ρ is calculated using the X-ray diffraction intensity (I) of an oriented sample. In the case of a tetragonal crystal having a (001) orientation, ρ is calculated from Equation 4 as the ratio of the total of the diffraction intensities of the (001) plane to the total diffraction intensity.

$$\rho = \Sigma I(001)/\Sigma I(hkl) \quad \text{(Equation 4)}$$

When the side average length of the sodium niobate particles having a shape of a cuboid is more than 100 μm, it is difficult to obtain a fired body having a sufficiently high density.

The sodium niobate powder of the present invention is a powder containing a large number of sodium niobate particles having a shape of a cuboid and having a side average length of 0.1 μm or more and 100 μm or less. The content of the sodium niobate particles having a shape of a cuboid and having a side average length of 0.1 μm or more and 100 μm or less in the sodium niobate powder is 90 wt % or more and preferably 95 wt % or more relative to all sodium niobate particles contained in the sodium niobate powder. For example, a sodium niobate powder containing 90 wt % or more of the sodium niobate particles having a shape of a cuboid and having a side average length of 0.1 μm or more and 100 μm or less may contain 10 wt % or less of sodium niobate particles having a side average length of less than 0.1 μm or more than 100 μm. More preferably, the sodium niobate powder contains 100 wt % of the sodium niobate particles having a shape of a cuboid and having a side average length of 0.1 μm or more and 100 μm or less. In this case, all sodium niobate particles are particles having a side average length of 0.1 μm or more and 100 μm or less.

At least one face of each of the sodium niobate particles having a shape of a cuboid is a (100) plane in the pseudocubic notation.

When one of the planes of each of the sodium niobate particles having a shape of a cuboid is a (100) plane, a (100)-oriented ceramic can be produced. The (100)-oriented ceramic means that the Lotgering factor that indicates the degree of (100) orientation is 10% or more.

In the case where a crystal formed by using the sodium niobate particles having a shape of a cuboid is a ferroelectric orthorhombic crystal, the spontaneous polarization axis extends in a direction parallel to a [110] direction. Therefore, the spontaneous polarization axis extends in a direction about ±45° inclined from the normal of a (100) plane of the crystal. When an electric field is applied in the [100] direction, an engineered domain structure is formed in the crystal and thus the piezoelectric performance is improved. In the case where the crystal is a ferroelectric tetragonal crystal, the spontaneous polarization axis extends in a direction parallel to a [100] direction. Therefore, the spontaneous polarization axis extends in a direction parallel to the normal of a (100) plane of the crystal. When an electric field is applied in the [100] direction, the spontaneous polarization parallel to the electric field is easily switched and thus the piezoelectric performance is improved.

In the case where at least one face of each of the sodium niobate particles having a shape of a cuboid is not a (100) plane in the pseudocubic notation, the crystal orientation of the sodium niobate particles having a shape of a cuboid is different in each plane of the cuboid. Therefore, for example, it is difficult to produce an oriented ceramic.

Although sodium niobate originally has an orthorhombic structure, sodium niobate is treated as a substance having a cubic structure, such as strontium titanate, for the convenience of notation in the present invention unless otherwise specified (pseudocubic notation). A solid solution of sodium niobate and barium titanate and a solid solution of sodium niobate and potassium niobate have one of a monoclinic structure, an orthorhombic structure, a tetragonal structure, and a cubic structure or have one or more of the crystal structures depending on the composition. However, in this specification, the solid solution of sodium niobate and barium titanate and the solid solution of sodium niobate and potassium niobate are also treated as substances having a pseudocubic structure like sodium niobate for the convenience of notation unless otherwise specified.

The crystal orientation of the plane of the sodium niobate particles having a shape of a cuboid according to the present invention can be determined by a simple method. For example, a sodium niobate powder is scattered on a smooth glass substrate and then vibration is added to the glass substrate for several seconds to several minutes to a degree that the vibration of the sodium niobate powder can be barely confirmed through visual inspection. Since the sodium niobate particles of the present invention have a shape of a cuboid, each of the particles moves while one of the planes of the cuboid is in contact with the surface of the glass substrate. The X-ray diffraction of the sodium niobate particles being present on the glass substrate is measured. If the relative diffraction intensity of 101/040 or 202/080 (the indices herein are indices of an orthorhombic crystal according to the card, and 101/040 and 202/080 are 100 and 200 in the pseudocubic notation, respectively) is high compared with powder X-ray card (e.g., ICDD No. 33-1270), at least one of the planes of each of the sodium niobate particles having a shape of a cuboid can be determined to be a (100) plane in the pseudocubic notation. The crystal orientation of the plane of the sodium niobate particles having a shape of a cuboid can also be determined by evaluating the relationship between the crystal orientation and the plane of the cuboid using a transmission electron microscope.

The moisture content of the sodium niobate powder of the present invention is 0.15 mass % or less. If the moisture content of the sodium niobate powder is more than 0.15 mass %, pores may be formed in the crystal grains or crystal grain boundary in the production process of ceramics. Alternatively, oxidation of an internal electrode may occur in a device in which a ceramic and an electrode are integrally fired.

In the present invention, the term "moisture content" means the ratio of the mass of moisture eliminated in a process in which the sodium niobate powder is fired into a ceramic, relative to the mass of the sodium niobate powder before firing. The term "moisture" herein includes both physically adsorbed water and constitution water. The firing temperature of sodium niobate is normally about 1150° C. to 1300° C. However, the amount of moisture eliminated at 700° C. or more is extremely small and thus the amount of moisture eliminated up to, for example, 900° C. may be measured for simple analysis. The moisture content of the sodium niobate powder can be determined from the result obtained by thermal desorption spectroscopy (TDS), thermogravimetry-differential thermal analysis (TG-DTA), Fourier transform infrared spectroscopy (FT-IR), or the like.

The moisture content of the sodium niobate powder of the present invention is preferably 0.10 mass % or less. When the moisture content is 0.10 mass % or less, the uniformity of ceramics composed of the sodium niobate powder of the present invention is considerably improved.

The advantageous effects of the present invention are further produced as the moisture content of the sodium niobate powder of the present invention decreases. Therefore, the lower limit of the moisture content is not set. However, the limit of measurement at which the moisture content cannot be distinguished from zero in terms of precision of the analysis technique is 0.001 mass %.

The sodium niobate powder can be represented by general formula (1) below.

$$Na_{1+x}NbO_{3+x/2} (-0.1 \leq x \leq 0.1)$$    General formula (1)

In general formula (1), when x is outside the range of −0.1≤x≤0.1, the sodium niobate powder does not have a perovskite single phase structure. If a piezoelectric material is produced using a sodium niobate powder not having a perovskite single phase structure, an impurity phase is unfavorably formed in the piezoelectric material, whereby the piezoelectric performance is degraded or the firing is unevenly performed.

The ratio $L_{max}/L_{min}$ of the maximum side length $L_{max}$ to the minimum side length $L_{min}$ of the sodium niobate particles can be 3 or less.

Since the aspect ratio is defined to be the ratio of the maximum side length to the minimum side length, the aspect ratio is always 1 or more. If the aspect ratio is more than 3 when a ceramic is produced using the sodium niobate powder, gaps are easily formed between grains and thus the density of a sintered body does not increase. Therefore, the ratio $L_{max}/L_{min}$ is preferably 3 or less, more preferably 2 or less, and further preferably 1.5 or less. The ratios $L_{max}/L_{min}$ of all sodium niobate particles contained in the sodium niobate powder of the present invention are not necessarily 3 or less. The ratios $L_{max}/L_{min}$ of, for example, 95% or more and preferably 99% or more of sodium niobate particles on a basis of the number of particles may be 3 or less.

(2) Method for Producing Sodium Niobate Powder

A method for producing a sodium niobate powder according to the present invention at least includes a step of holding an aqueous alkali dispersion liquid containing at least a niobium component and a sodium component at a pressure exceeding 0.1 MPa, a step of isolating a solid matter from the aqueous dispersion liquid after the holding, and a step of heat treating the solid matter at 500° C. or more and 700° C. or less.

The niobium component can be selected from, for example, niobium oxide and niobium halide. Examples of the niobium halide include niobium fluoride, niobium chloride, niobium bromide, and niobium iodide.

The sodium component can be a hydroxide such as sodium hydroxide. The concentration of the sodium hydroxide can be 2 M or more. If the concentration of the sodium hydroxide is less than 2 M, the synthesized sodium niobate particles have an amorphous shape and do not have a shape of a cuboid. When the concentration of the sodium hydroxide is 2 M or more, sodium niobate particles produced by the method according to the present invention can have a shape of a cuboid.

The aqueous dispersion liquid includes a dispersion medium mainly composed of 51 mass % or more of water and a solute dispersed or partly dissolved in the dispersion medium.

The term "alkali" means a property in which hydroxyl ions (OH⁻) are formed as a result of dissolution in water to show a pH of 7 or more. The atmosphere at a pressure exceeding 0.1 MPa is obtained by inserting the aqueous dispersion liquid into a container that can be hermetically sealed, such as an autoclave, and heating the container. The internal pressure of the autoclave reaches a value close to the saturation vapor pressure of water at a holding temperature of the container. When the aqueous dispersion liquid is inserted into the container, the container should not be filled with the aqueous dispersion liquid. In general, the volume of the aqueous dispersion liquid is set to be smaller than the volume of the container, for example, 80% or less of the volume of the container.

In the step of isolating a solid matter from the aqueous dispersion liquid, a desired solid matter can be obtained by a typical process including filtration, washing, and drying. However, the process is not particularly limited. The number of washing, a solvent used in the washing, and the like are also not particularly limited and can be suitably selected.

The step of heat treating the solid matter is performed at 500° C. or more and 700° C. or less. If the heat treatment temperature is less than 500° C., the constitution water cannot be efficiently removed and the amount of moisture contained in sodium niobate as a product is as large as, for example, 0.19 mass %. If the heat treatment temperature is more than 700° C., the crystal growth of the sodium niobate particles is facilitated. As a result, large crystal grains may be formed or the grains may have a shape other than the shape of a cuboid. The step of heat treating the solid matter can be performed in an inert gas atmosphere, an air atmosphere, an excess oxygen atmosphere, or the like, and the atmosphere is not particularly limited. The heat treatment time is not particularly limited, but can be, for example, 1 to 6 hours. If the heat treatment time is less than 1 hour, the constitution water contained in the particles may be insufficiently removed. As the heat treatment time increases, the amount of moisture removed increases. However, from the viewpoint of work efficiency and cost, the effect of removing moisture can be sufficiently produced through the heat treatment for 6 hours or less.

The step of holding the aqueous alkali dispersion liquid can be performed at 141° C. to 260° C. for 1 to 100 hours.

If the temperature at which the aqueous dispersion liquid is held is 140° C. or less, sodium niobate particles having a shape of a cuboid are sometimes not obtained. If the temperature at which the aqueous dispersion liquid is held is unfavorably more than 260° C., a Teflon (registered trademark) container for holding the aqueous dispersion liquid cannot be used.

If the time for which the aqueous dispersion liquid is held is unfavorably less than 1 hour, sodium niobate particles having a shape of a cuboid can be obtained, but the variation in particle diameter increases. If the time for which the aqueous dispersion liquid is held is more than 100 hours, the production efficiency of the sodium niobate particles decreases, which is industrially unfavorable.

The magnitude of the size variation of the sodium niobate particles contained in the sodium niobate powder of the present invention can be determined from the distribution of the side average lengths of the particles, the distribution being obtained by measuring the particles with a microscope. In the sodium niobate particles having a side average length of 0.1 μm or more and 100 μm or less, if the side average length varies from particle to particle in the range of about five times or more, such as 1 to 15 μm or 3 to 15 μm, the size variation is determined to be large. If the side average length varies from particle to particle in the range of less than five times, the size variation is determined to be small. Herein, the size variation is not evaluated by using the maximum side average length and the minimum side average length observed. The size variation is evaluated using particles mainly constituting the powder. For example, the side average length of a statistically sufficient number of particles (e.g., arbitrarily selected 100 particles) is measured with a microscope, and the size variation is evaluated using 60% of particles mainly constituting the size distribution. The magnitude of the size variation of the sodium niobate particles contained in the sodium niobate powder of the present invention may also be determined using a particle size analyzer. For example, the particle size distribution of the particles is measured and the size variation is evaluated using the particle size distribution of 60% of particles mainly constituting the powder.

The production method of the present invention is obtained by combining a heat treatment process in a particular temperature range with a method for producing a powder in a liquid phase, the method generally being called a solvothermal process or a hydrothermal synthesis process.

(3) Method for Producing Ceramic

A method for producing a ceramic according to the present invention includes a step of obtaining a compact by molding a raw material powder containing the sodium niobate powder of the present invention and a step of firing the compact.

Other raw materials may be optionally added to the sodium niobate powder of the present invention. For example, raw material powders of barium titanate, potassium niobate, bismuth ferrate, and bismuth sodium titanate may be added to the sodium niobate powder of the present invention. When the content of the sodium niobate powder of the present invention in the mixed powder is 51 vol % or more, preferably 70 vol % or more, and more preferably 85 vol % or more, the effect of the sodium niobate powder whose moisture content is decreased according to the present invention can be produced. When the content of the sodium niobate powder of the present invention in the mixed powder is 51 vol % or more, the orientation effect of ceramics due to the shape of a cuboid can be expected. The other raw material powders can also be heat treated at 500° C. to 700° C. beforehand to decrease the amount of moisture. The other raw material powders can also be produced by a solvothermal process or a hydrothermal synthesis process.

The sodium niobate powder of the present invention or the mixed powder is molded into a compact and the compact is fired, whereby an oriented ceramic having a (100)-oriented perovskite structure in the pseudocubic notation is obtained. In general, the firing step is performed in an air atmosphere. The firing temperature is dependent on the types of materials and is in the range of 900° C. to 1500° C. The firing time can be about 1 to 6 hours. The temperature profile relative to the time in an oven in the firing step can be freely adjusted in order to increase the degree of orientation or the density of a sintered body. For example, the heating rate may be decreased in a certain temperature section in order to increase the degree of orientation. The firing temperature may be temporarily increased in order to increase the density of a sintered body.

The step of obtaining a compact can include a substep of performing sheet forming on a slurry containing the sodium niobate powder to obtain a green sheet and a substep of stacking the green sheet to obtain a compact.

A method for preparing the slurry is not limited. A method for preparing an organic solvent slurry is exemplified below. An aqueous solvent may be used for the slurry.

The sodium niobate powder and optionally a powder (e.g., a powder of barium titanate, potassium niobate, bismuth ferrate, or bismuth sodium titanate) other than the sodium niobate powder are inserted into a container and mixed with each other to prepare a raw material powder. Subsequently, a solvent having a weight 1.6 to 1.7 times the weight of the raw material powder is added to the raw material powder. A mixed solvent of toluene and ethanol or n-butyl acetate can be used as the solvent. Mixing is performed using a ball mill for 24 hours and then a binder and a plasticizer are added thereto. In the ball mill step, the size, material, and amount of balls are adjusted so as not to break the sodium niobate particles having a shape of a cuboid. When polyvinyl butyral (PVB) is used as the binder, PVB is weighed so that the weight ratio of the solvent to PVB is, for example, 88:12. When dibutyl phthalate is used as the plasticizer, dibutyl phthalate is weighed so that the weight thereof is the same as that of the binder. Mixing is performed again using a ball mill overnight. The amounts of the solvent and binder are adjusted so that the viscosity of the slurry is approximately 300 to 500 mPa·s.

Sheet forming is performed using the thus-prepared slurry. The sheet forming can be performed by, for example, a doctor blade method.

In the doctor blade method, a slurry containing a raw material, a solvent, a dispersing agent, an organic binder, a plasticizer, and the like is prepared, and a plate-shaped compact is formed on a carrier film such as a polyethylene terephthalate (PET) film while adjusting the thickness of the compact using a blade-shaped part. The tape-shaped ceramic compact obtained by such a method is referred to as a green sheet. In the present invention, sheet forming that uses an applicator is also regarded as part of the doctor blade method.

The sheet forming can be performed by a method other than the doctor blade method. For example, the slurry containing the sodium niobate particles having a shape of a cuboid is dropped on a smooth glass plate. The slurry is spread into a film shape, for example, by inclining the glass plate. The film-shaped slurry is dried to obtain a green sheet. Alternatively, the slurry is applied onto a suitable disc by spin coating. The slurry spread into a film shape is dried to obtain a green sheet.

The green sheet is stacked to obtain a compact. The green sheet obtained by the above method can be subjected to thermal press-bonding until a desired thickness is achieved. Ten to hundred layers of the green sheet are stacked, and then a pressure of 10 to 60 MPa is applied in the stacking direction, for example, at 50° C. to 80° C. for 10 seconds to 10 minutes. Thus, the green sheet can be stacked. By printing a paste containing sliver, palladium, or platinum as a component between the layers of the green sheet, a ceramic including an internal electrode can be produced.

The obtained green sheet or a multilayered body composed of the green sheets can be cut into a desired shape and fired to obtain an oriented ceramic having a (100)-oriented perovskite structure in the pseudocubic notation.

EXAMPLES

The present invention will now be more specifically described based on Examples, but is not limited to Examples below.

Production Example 1

A mixed powder was prepared by mixing 10 g of $Nb_2O_5$ (manufactured by KANTO CHEMICAL CO., INC.) and 52 g of $K_2CO_3$ (manufactured by KANTO CHEMICAL CO., INC.). The mixed powder was melted using a platinum crucible in the air at 950° C. for one hour. After one hour, the crucible was rapidly cooled. The resultant white lump was dissolved in 500 ml of water. The solution was then filtered through a filter having a mesh size of 0.5 nm to remove insoluble matter. Into a sample from which the insoluble matter was removed, 200 ml of $HNO_3$ (manufactured by KANTO CHEMICAL CO., INC.) and 300 ml of water were gradually added. Consequently, a white powder was precipitated. The precipitate was collected using a filter and washed with water. The collected product was dried at 50° C.

The sample obtained by this method was an amorphous niobium oxide hydrate represented by general formula (2). General formula (2) $Nb_2O_5 \cdot nH_2O$ ($1<n<3$) When this sample was evaluated by X-ray diffraction, a diffraction peak derived from niobium oxide was not detected. Furthermore, n in general formula (2) determined from the change in the weight of the sample before and after heating was 1.5.

Subsequently, a sodium niobate powder was synthesized using the obtained niobium oxide hydrate as a raw material. Into a 70 ml autoclave including a Teflon (registered trademark) jacket, 1 g of the niobium oxide hydrate and 50 ml of 2 M (mole/liter) aqueous sodium hydroxide solution were added. The autoclave was hermetically sealed, held at 180° C. for 24 hours, and then slowly cooled to room temperature. During the holding at high temperature, the pressure inside the autoclave was 0.1 MPa or more. The contents taken out of the autoclave were filtered to obtain a product. The product was washed with distilled water and then dried at 50° C. to obtain a sample.

Production Example 2

A sodium niobate powder was synthesized under the same conditions as those of Production Example 1, except that the concentration of the sodium hydroxide was changed to 4 M.

Production Example 3

A sodium niobate powder was synthesized under the same conditions as those of Production Example 2, except that the reaction temperature was changed to 200° C.

Production Example 4

A sodium niobate powder was synthesized under the same conditions as those of Production Example 2, except that the reaction time was changed to 48 hours.

Production Example 5

A sodium niobate powder was synthesized under the same conditions as those of Production Example 2, except that the reaction time was changed to 96 hours.

Evaluation of Structure

The constituent phase of each of the samples obtained in Production Examples 1 to 5 was measured by X-ray diffraction. The shape and side average length were measured with a scanning electron microscope. The composition was measured by inductively coupled plasma (ICP) analysis.

It was found from the X-ray diffraction that the obtained particles had an orthorhombic structure composed of a sodium niobate single phase, which was a perovskite single phase structure. As a result of the observation with a microscope, the particles were found to have a shape of a cuboid in which an angle between planes was within 90°±10°. The side average length was determined by averaging the lengths of three sides when each of the particles was assumed to have a shape of a cuboid. The variation in the side average length of arbitrarily selected 100 particles among particles confirmed through visual inspection was three times or less and the particle size distribution was small. Assuming that the minimum side length of the particles having a shape of a cuboid was $L_{min}$ and the maximum side length of the particles having a shape of a cuboid was $L_{max}$, the ratio $L_{max}/L_{min}$ of each of the particles having a shape of a cuboid was 3 or less.

It was found from the ICP analysis that the Na/Nb molar ratio of the sodium niobate powder produced in the present invention was 0.9 to 1.1. The average Na/Nb molar ratio was 1.03.

Examples 1 to 12

The samples obtained in Production Examples 1 to 5 were each heat treated at a predetermined temperature in the range of 500° C. to 700° C. for 1 to 6 hours, then slowly cooled to room temperature, and left to stand in the air for 24 hours to obtain a sodium niobate powder of the present invention (treatment A). The sodium niobate powder of the present invention subjected to the treatment A was stored in a thermostat oven at 25° C. and 90% for two days (treatment B).

Comparative Example 1

The sample obtained in Production Example 2 was heat treated (dried) at 100° C. for 10 hours, then slowly cooled to room temperature, and left to stand in the air for 24 hours to obtain a sodium niobate powder for comparison (treatment A).

Comparative Examples 2 and 3

The sample obtained in Production Example 2 was heat treated at 450° C. (Comparative Example 2) or at 750° C. (Comparative Example 3) for 1 hour, then slowly cooled to room temperature, and left to stand in the air for 24 hours to obtain a sodium niobate powder for comparison (treatment A). The sodium niobate powder for comparison subjected to the treatment A was stored in a thermostat oven at 25° C. and 90% for two days (treatment B).

Comparative Example 4

A mixed powder was prepared by weighing $Na_2CO_3$ and $Nb_2O_5$ so that Na:Nb=1:1 was satisfied. A sodium niobate powder was produced by a solid state reaction in which the mixed powder was fired at 1000° C. The resultant sample was heat treated at 600° C. for 1 hour, then slowly cooled to room temperature, and left to stand in the air for 24 hours to obtain a sodium niobate powder for comparison (treatment A). The sodium niobate powder for comparison subjected to the treatment A was stored in a thermostat oven at 25° C. and 90% for two days (treatment B).

Evaluation of Moisture Content

The moisture content of each of the sodium niobate powders of the present invention obtained in Examples 1 to 12 and the sodium niobate powders for comparison obtained in Comparative Examples 1 to 4 was measured using a thermal desorption spectroscopy (TDS).

Table 1 shows the results.

Table 1 shows the concentration of the aqueous sodium hydroxide solution, the reaction temperature in the hydrothermal synthesis, the reaction time, the side average length of the sodium niobate particles, the length being estimated through the observation with scanning electron microscope, the heating temperature and heating time in the heat treatment step, and the moisture content of the powder measured by TDS.

Regarding the side average length (μm) of the sodium niobate particles, the average length of three sides of each of 100 particles arbitrarily selected from the sample of the sodium niobate powder was measured through the observation with scanning electron microscope, and Table 1 shows the minimum length and the maximum length. In all Examples and Comparative Examples, the size variation in the average length of three sides of each of the particles was 2 times or less from the calculation in terms of the maximum length and minimum length and 1.8 times or less from the calculation in terms of the size of 60% of particles mainly constituting the powder.

TABLE 1

| | Production conditions | | | | Conditions of treatment (A) | | | |
|---|---|---|---|---|---|---|---|---|
| | NaOH concentration (M) | Reaction temperature (° C.) | Reaction time (hour) | Side average length (μm) | Heating temperature (° C.) | Heating time (hour) | Moisture content (mass %) | |
| | | | | | | | Treatment (A) | Treatment (B) |
| Example 1 | 4 | 180 | 24 | 5-10 | 500 | 1 | 0.116 | 0.129 |
| Example 2 | 4 | 180 | 24 | 5-10 | 550 | 1 | 0.087 | 0.093 |
| Example 3 | 4 | 180 | 24 | 5-10 | 600 | 1 | 0.074 | 0.048 |
| Example 4 | 4 | 180 | 24 | 5-10 | 650 | 1 | 0.075 | 0.071 |
| Example 5 | 4 | 180 | 24 | 5-10 | 700 | 1 | 0.069 | 0.069 |
| Example 6 | 4 | 180 | 24 | 5-10 | 700 | 6 | 0.052 | 0.055 |
| Example 7 | 2 | 180 | 24 | 5-10 | 500 | 1 | 0.144 | 0.131 |
| Example 8 | 4 | 200 | 24 | 5-10 | 520 | 1 | 0.101 | 0.095 |
| Example 9 | 4 | 180 | 48 | 10-15 | 600 | 1 | 0.066 | 0.072 |

TABLE 1-continued

| | Production conditions | | | Conditions of treatment (A) | | | | |
|---|---|---|---|---|---|---|---|---|
| | NaOH | Reaction | Reaction | Side average | Heating | | Moisture content (mass %) | |
| | concentration (M) | temperature (° C.) | time (hour) | length (μm) | temperature (° C.) | Heating time (hour) | Treatment (A) | Treatment (B) |
| Example 10 | 4 | 180 | 96 | 10-20 | 650 | 1 | 0.055 | 0.050 |
| Example 11 | 2 | 180 | 24 | 5-10 | 700 | 1 | 0.059 | 0.068 |
| Example 12 | 4 | 180 | 48 | 10-15 | 700 | 10 | 0.051 | 0.051 |
| Comparative Example 1 | 4 | 180 | 24 | 5-10 | 100 | 10 | 0.438 | No measurement |
| Comparative Example 2 | 4 | 180 | 24 | 5-10 | 450 | 1 | 0.160 | 0.189 |
| Comparative Example 3 | 4 | 180 | 24 | 5-10 | 750 | 1 | Could not be measured because of grain growth | |
| Comparative Example 4 | (solid phase reaction) | | | (amorphous) | 600 | 1 | 0.454 | 0.536 |

Figure 1B:
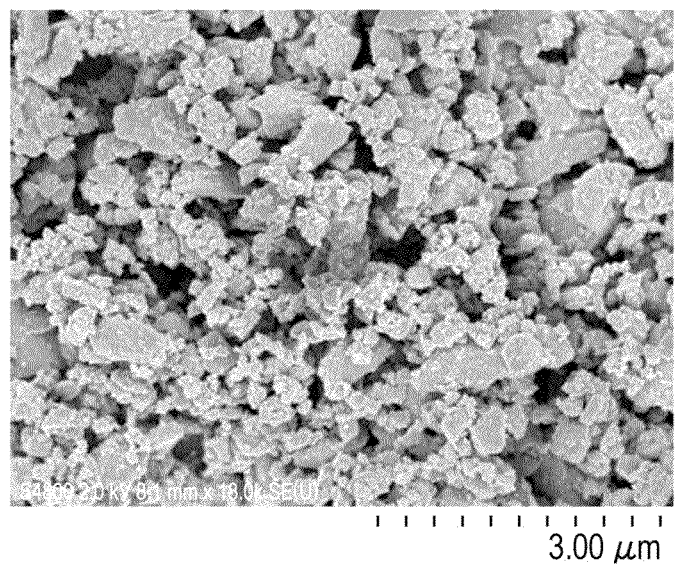
FIG. 1B is a scanning electron microscope photograph showing a sodium niobate powder used in Comparative Example 4.

FIG. 1A is a scanning electron microscope photograph showing the sodium niobate powder having a shape of a cuboid of Production Example 2, which was used in Examples 1 to 6 of the present invention. FIG. 1B is a scanning electron microscope photograph showing the sodium niobate powder of Comparative Example 4, which was produced by solid state reaction using $Nb_2O_5$ and $Na_2CO_3$ as raw materials.

Figure 2:
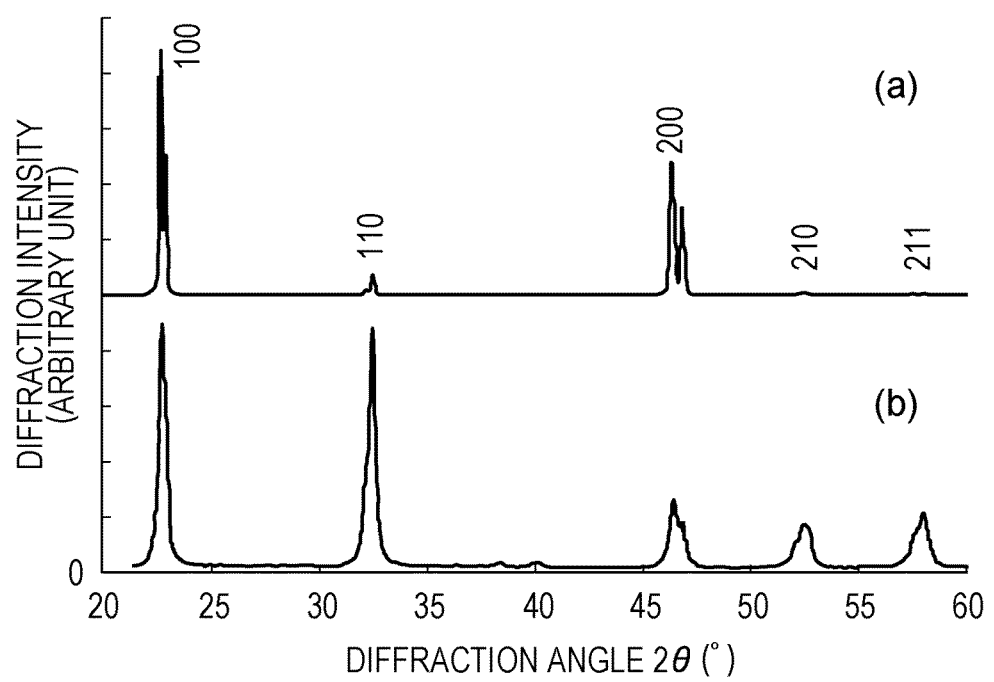
FIG. 2 shows X-ray diffraction patterns of the sodium niobate powder having a shape of a cuboid and used in Examples 1 to 6 of the present invention and the sodium niobate powder used in Comparative Example 4.

FIG. 2 shows X-ray diffraction patterns of (a) the sodium niobate powder having a shape of a cuboid of Production Example 2, which was used in Examples 1 to 6 of the present invention, and (b) the sodium niobate powder of Comparative Example 4, which was produced by solid state reaction using $Nb_2O_5$ and $Na_2CO_3$ as raw materials. In FIG. 2, the diffraction index is expressed in the pseudocubic notation.

Figure 3:
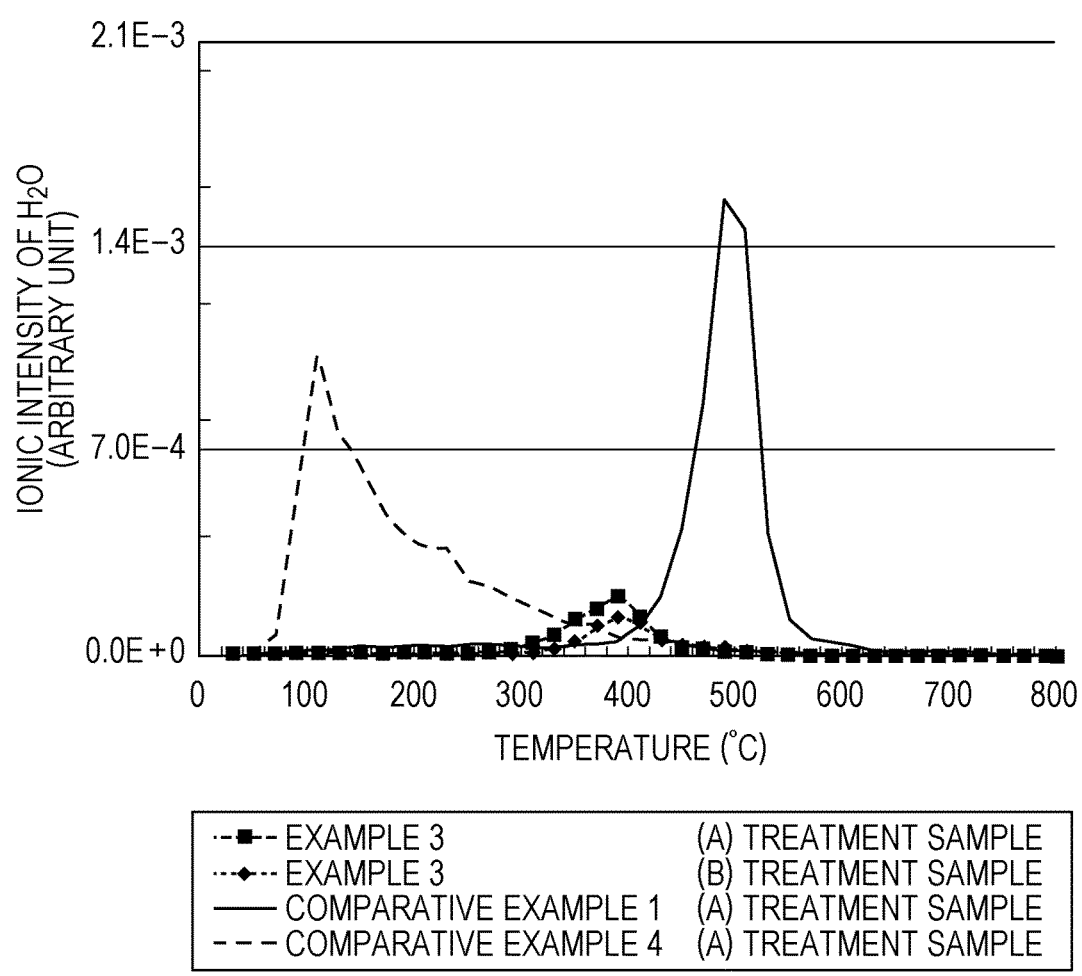
FIG. 3 shows the measurement results of treatment samples of Example 3 and Comparative Examples 1 and 4 by thermal desorption spectroscopy (TDS).

FIG. 3 shows the measurement results of the (A) and (B) treatment samples of Example 3, the (A) treatment sample of Comparative Example 1, and the (A) treatment sample of Comparative Example 4 by thermal desorption spectroscopy (TDS). FIG. 3 shows the thermal desorption profile in which the horizontal axis indicates the heating temperature and the vertical axis indicates the intensity corresponding to water. The temperature-increasing conditions are not particularly specified. In the results shown in Table 1 and FIG. 3, the temperature was increased from room temperature to 800° C. at 20° C./min. The error between the moisture content measured when the temperature was increased from room temperature to 800° C. and the moisture content measured when the temperature was increased from room temperature to 1000° C. was within +1% on a basis of the values shown in Table 1.

Referring to FIG. 3, in the sodium niobate powder of Comparative Example 4 produced by solid state reaction, a desorption peak that is derived from physically adsorbed water and has the maximum value at about 100° C. was detected. It is believed that the physically adsorbed water adsorbed in a temperature-decreasing process after the heat treatment at 600° C. for 1 hour. In the sample of Comparative Example 1 obtained by heat treating, at 100° C. for 10 hours, the sodium niobate powder produced by a hydrothermal synthesis method, a desorption peak that is derived from constitution water and has the maximum value at about 500° C. was detected.

In contrast, regarding the sodium niobate powders of Examples 1 to 12, both constitution water and physically adsorbed water were substantially eliminated not only in the sample heat treated at 600° C. for one hour but also in the sample stored in a thermostat oven at 25° C. and 90% for two days. In other words, it is clear that the constitution water and physically adsorbed water desorbed through the heat treatment at 600° C. for one hour do not adsorb again even after the storage in a thermostat oven at 25° C. and 90% for two days.

In metal oxide particles, the desorption of constitution water contained in the particles is generally an irreversible process. On the other hand, in general, physically adsorbed water repeatedly adsorbs to the adsorption sites of the particles in a reversible manner. The sodium niobate particles of the present invention have a shape of a cuboid whose surface is extremely flat without pores. Furthermore, the sodium niobate particles substantially do not have a polar group such as a hydroxyl group that serves as an adsorption site for water molecules. Therefore, the adsorption of physically adsorbed water is believed to be prevented.

Example 13

Method for Producing Ceramic

Each of the sodium niobate powders produced in Examples 1, 3, and 5 was mixed with a barium titanate powder (BT-01 manufactured by Sakai Chemical Industry Co., Ltd.) to prepare a mixed powder. The molar ratio of the sodium niobate powder having a shape of a cuboid to the barium titanate powder was 88:12. The ratio of the sodium niobate powder to the mixed powder was 87 vol %.

A green sheet was prepared by a doctor blade method using the mixed powder as a raw material. Specifically, the mixed powder and a solvent having a weight 1.6 to 1.7 times the weight of the mixed powder were inserted into a container. A mixed solvent of toluene and ethanol was used as the solvent. The weight ratio of toluene and ethanol was 53:47. Zirconia balls having a diameter of 5 mm were added to the slurry and mixing was performed using a ball mill for 24 hours. Subsequently, a binder and a plasticizer were added to the mixture. Polyvinyl butyral (PVB, BH-3 manufactured by Sekisui Chemical Co., Ltd.) was used as the binder. The weight of PVB was 0.07 times the weight of the particles in the slurry. Dibutyl phthalate was added as the plasticizer in the same amount as that of the binder. Mixing in a ball mill was performed again overnight. The amounts of the solvent and binder were adjusted so that the viscosity of the slurry was approximately 300 to 500 mPa·s. The zirconia balls were removed from the slurry and then vacuum degassing was performed.

A green sheet was prepared from the slurry using a doctor blade apparatus.

The green sheet was dried overnight. A plurality of the green sheets were stacked on top of one another and thermal press-bonding was performed by applying a pressure of 50 kg/cm² at 85° C. to obtain a compact. The green sheets subjected to thermal press-bonding were cut into a suitable size and fired. Herein, the firing temperature was held at 600° C. to perform debinding and then the green sheets were fired at 1260° C. for 6 hours. The obtained ceramic was a solid solution of barium titanate and (100)-oriented sodium niobate in the pseudocubic notation.

Production of Ceramic for Comparison

A ceramic was produced in the same manner using the sodium niobate powder produced in Comparative Example 1.

Evaluation of Piezoelectricity of Ceramic

The thus-obtained ceramic was polished until the thickness reached 500 μm to obtain a sample. An organic component on the surface of the sample was removed by annealing the sample at 450° C. for 1 hour. An adhesive layer composed of titanium and having a thickness of 3 nm was then formed on the upper and lower surfaces of the sample by DC sputtering. An electrode layer composed of gold and having a thickness of 300 nm was formed thereon. The piezoelectric material including an electrode was cut into a size of 2.5 mm×10 mm. Through the above process, a plate-like piezoelectric ceramic sample piece was obtained. The plate-like sample was inserted into silicone oil and a direct-current voltage of 30 kV/cm was applied at 150° C. for 30 minutes to perform a polarization treatment. The piezoelectric constant $d_{33}$ of the piezoelectric ceramic was evaluated by a resonance-antiresonance method. The piezoelectric constant $d_{33}$ of the ceramics produced from the sodium niobate powders of Examples 1, 3, and 5 was in the range of 40 to 50 pC/N whereas the piezoelectric constant $d_{33}$ of the ceramic produced from the sodium niobate powder of Comparative Example 1 was in the range of 30 to 40 pC/N. As is clear from the results, the piezoelectric property of the piezoelectric ceramic according to the present invention is excellent.

Evaluation of Amount of Pores Formed

The evaluation of the amount of pores formed is described below, but the evaluation method is not limited thereto.

The ceramic was polished until the thickness reached 500 μm. The surface subjected to the polishing was observed using a scanning electron microscope. A photo image of crystal grains was obtained in a field of view of 50 μm×50 μm, and the image of pores present in the crystal grains and crystal grain boundary was subjected to binary image processing. The equivalent circular diameter that represents the diameter of a perfect circle having the same area as the projected area of a pore was determined from the processed image. The average equivalent circular diameter (number average) was then determined from the equivalent circular diameter.

Table 2 shows the evaluation results.

Table 2 shows the heating temperature and heating time in the heat treatment step and the pore size of the obtained ceramic. The pore size was evaluated as follows. An evaluation of "Excellent" was given when the average equivalent circular diameter was 1 μm or less. An evaluation of "Fair" was given when the average equivalent circular diameter was 1 to 3 μm. An evaluation of "Poor" was given when the average equivalent circular diameter was 3 μm or more.

TABLE 2

| | Heat treatment | | |
|---|---|---|---|
| | Heating temperature (° C.) | Heating time (hour) | Pore size |
| Example 1 | 500 | 1 | Fair |
| Example 3 | 600 | 1 | Excellent |
| Example 5 | 700 | 1 | Excellent |
| Comparative Example 1 | 100 | 10 | Poor |

As is clear from Table 2, the pore size of the ceramic obtained from the sodium niobate powder produced under the conditions of Comparative Example 1 was large whereas the pore sizes of the ceramics obtained from the sodium niobate powders produced under the conditions of Examples 1, 3, and 5 were small. It was found that the ceramic produced from the sodium niobate powder of Example 3 had the smallest pore size and the smallest number of pores formed.

Hereinafter, a piezoelectric element that uses the above ceramic will now be described in detail with reference to the attached drawings. The description includes the choice of electrode materials and the polarization treatment.

Electrode

Figure 4:
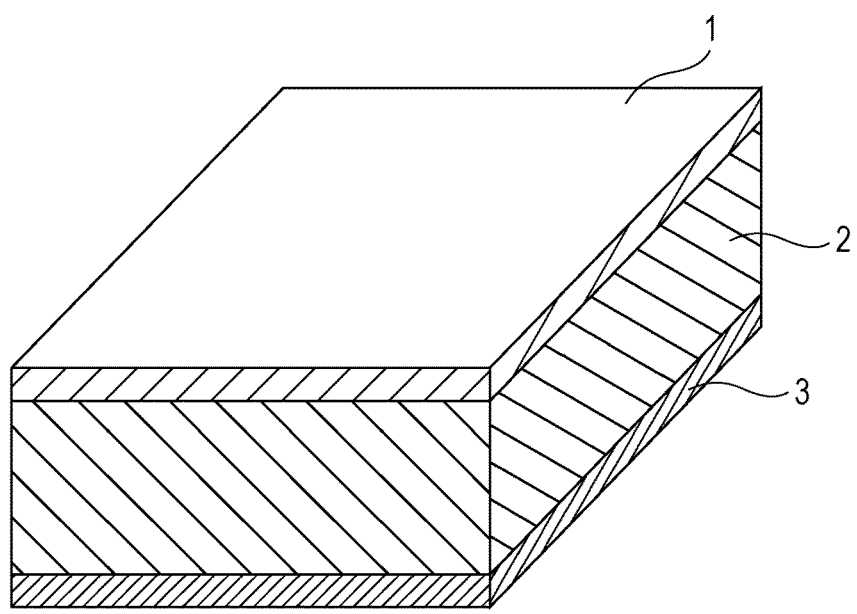
FIG. 4 is a schematic view showing a structure of a piezoelectric element according to an embodiment of the present invention.

FIG. 4 is a schematic view showing a structure of a piezoelectric element according to an embodiment of the present invention. The piezoelectric element according to the present invention includes at least a first electrode 1, a piezoelectric ceramic 2, and a second electrode 3, and the piezoelectric ceramic 2 is the piezoelectric ceramic of the present invention.

By disposing the first electrode and the second electrode on the piezoelectric ceramic according to the present invention to form a piezoelectric element, the piezoelectric property can be evaluated. The first electrode and second electrode are each composed of a conductive material having a thickness of about 5 to 2000 nm. The material is not particularly limited and any material that is usually used in piezoelectric elements can be used. Examples of such a material include metals such as Ti, Pt, Ta, Ir, Sr, In, Sn, Au, Al, Fe, Cr, Ni, Pd, Ag, and Cu and compounds thereof.

The first and second electrodes may each be composed of one of these materials or may each be prepared by stacking two or more of these materials. The first and second electrodes may be composed of materials different from each other.

The method for producing the first and second electrodes is not limited. For example, the electrodes may be formed by baking a metal paste, by sputtering, or by vapor deposition. The first and second electrodes may be patterned into a desired shape.

Polarization Treatment

The piezoelectric element can have spontaneous polarization axes oriented in a particular direction. When polarization axes are oriented in a particular direction, the piezoelectric constant of the piezoelectric element is increased.

The polarization method for the piezoelectric element is not particularly limited. The polarization treatment may be conducted in the air or in silicone oil. The temperature during polarization can be 60° C. to 150° C., but optimum conditions slightly vary depending on the composition of the piezoelectric ceramic constituting the element. The electric field applied to conduct the polarization treatment can be 800 V/mm to 2.0 kV/mm.

Method for Measuring Mechanical Quality Factor

The piezoelectric constant and mechanical quality factor of the piezoelectric element can be calculated from a resonant frequency and an antiresonant frequency measured with a commercially available impedance analyzer on the basis of Japan Electronics and Information Technology Industries Association Standard (JEITA EM-4501). This method is hereinafter referred to as a resonance-antiresonance method.

Structure of Multilayered Piezoelectric Element

A multilayered piezoelectric element that uses the piezoelectric ceramic of the present invention will now be described.

A multilayered piezoelectric element according to the present invention includes a piezoelectric ceramic layer and an electrode layer including an internal electrode that are alternately stacked. The piezoelectric ceramic layer is composed of the piezoelectric ceramic of the present invention.

Figure 5A:
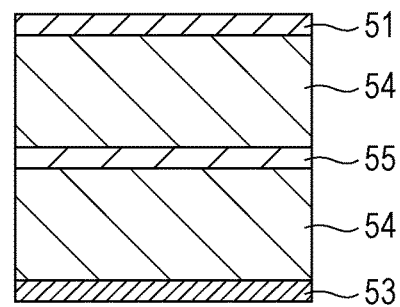
FIG. 5A is a schematic sectional view showing a structure of a multilayered piezoelectric element according to an embodiment of the present invention.
Figure 5B:
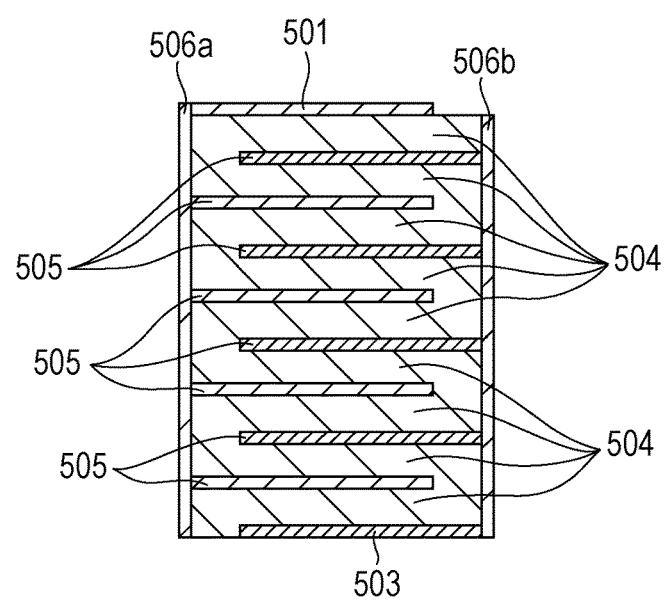
FIG. 5B is a schematic sectional view showing a structure of a multilayered piezoelectric element according to an embodiment of the present invention.

FIGS. 5A and 5B are each a schematic sectional view showing a structure of the multilayered piezoelectric element according to an embodiment of the present invention. The multilayered piezoelectric element according to the present invention includes a piezoelectric ceramic layer 54 and an electrode layer including an internal electrode 55 that are alternately stacked. The piezoelectric ceramic layer 54 is composed of the above-described piezoelectric ceramic. The electrode layer may include external electrodes such as a first electrode 51 and a second electrode 53, in addition to the internal electrode 55.

FIG. 5A shows a structure of a multilayered piezoelectric element according to the present invention. The multilayered piezoelectric element includes two piezoelectric ceramic layers 54 and one layer of the internal electrode 55 alternately stacked, and the multilayered structure is sandwiched between a first electrode 51 and a second electrode 53. The number of the piezoelectric ceramic layers and the number of layers of inner electrodes may be increased as shown in FIG. 5B and are not particularly limited. A multilayered piezoelectric element shown in FIG. 5B includes nine piezoelectric ceramic layers 504 and eight layers of internal electrode 505 alternately stacked, and the multilayered structure is sandwiched between a first electrode 501 and a second electrode 503. The multilayered piezoelectric element includes an external electrode 506a and an external electrode 506b for short-circuiting the internal electrodes alternately stacked.

The internal electrodes 505 and external electrodes 506a and 506b may have a size and shape different from those of the piezoelectric ceramic layer 504 and may be divided into a plurality of segments.

Each of the internal electrodes 55 and 505 and the external electrodes 506a and 506b is composed of a conductive material having a thickness of about 5 to 2000 nm. The material is not particularly limited and any material that is usually used in piezoelectric elements may be used. Examples of such a material include metals such as Ti, Pt, Ta, Ir, Sr, In, Sn, Au, Al, Fe, Cr, Ni, Pd, Ag, and Cu and compounds thereof. Each of the internal electrodes 55 and 505 and the external electrodes 506a and 506b may be composed of one of these materials or a mixture or alloy of two or more of these materials, or may be prepared by stacking two or more of these materials. The electrodes may be composed of materials different from each other.

In the multilayered element of the present invention, the internal electrode contains Ag and Pd and the weight ratio M1/M2 of a Ag content M1 to a Pd content M2 can satisfy $0.25 \leq M1/M2 \leq 4.0$. If the weight ratio M1/M2 is less than 0.25, the sintering temperature of the internal electrode is unfavorably increased. If the weight ratio M1/M2 is more than 4.0, an island-shaped internal electrode is formed and unevenness is unfavorably generated in its surface. More preferably, the weight ratio M1/M2 satisfies $2.3 \leq M1/M2 \leq 3.0$.

In view of low cost of electrode materials, the internal electrodes 55 and 505 can contain at least one of Ni and Cu. When the internal electrodes 55 and 505 contain at least one of Ni and Cu, the multilayered piezoelectric element of the present invention can be fired in a reducing atmosphere.

As shown in FIG. 5B, the electrodes including the internal electrodes 505 may be short-circuited from each other to make driving voltage phases match. For example, the internal electrodes 505, the first electrode 501, and the second electrode 503 may be short-circuited in an alternating manner. The form of short-circuiting between the electrodes is not particularly limited. Electrodes and/or wires may be formed on side surfaces of the multilayered piezoelectric element to conduct short-circuiting, or through holes penetrating through the piezoelectric ceramic layers 504 may be formed and filled with a conductive material so as to short-circuit the electrodes.

Liquid Discharge Head

A liquid discharge head that uses the piezoelectric element of the present invention will now be described.

A liquid discharge head according to the present invention includes at least a liquid chamber equipped with a vibrating unit that includes the above-described piezoelectric element or multilayered piezoelectric element and an ejection port in communication with the liquid chamber.

Figure 6A:
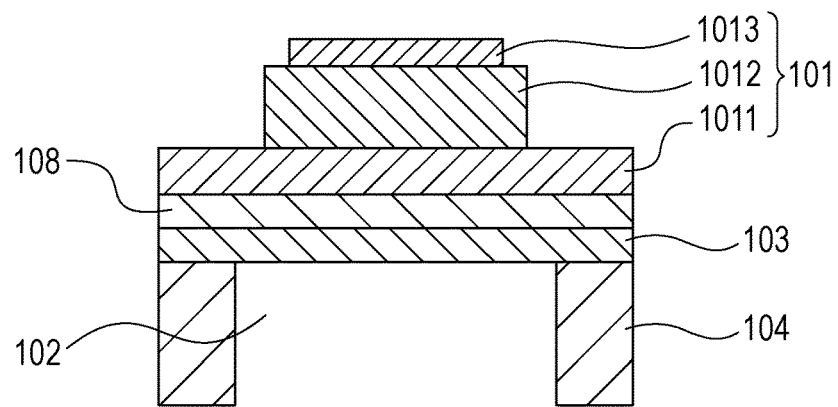
FIG. 6A is a schematic view showing a structure of a liquid discharge head according to an embodiment of the present invention.
Figure 6B:
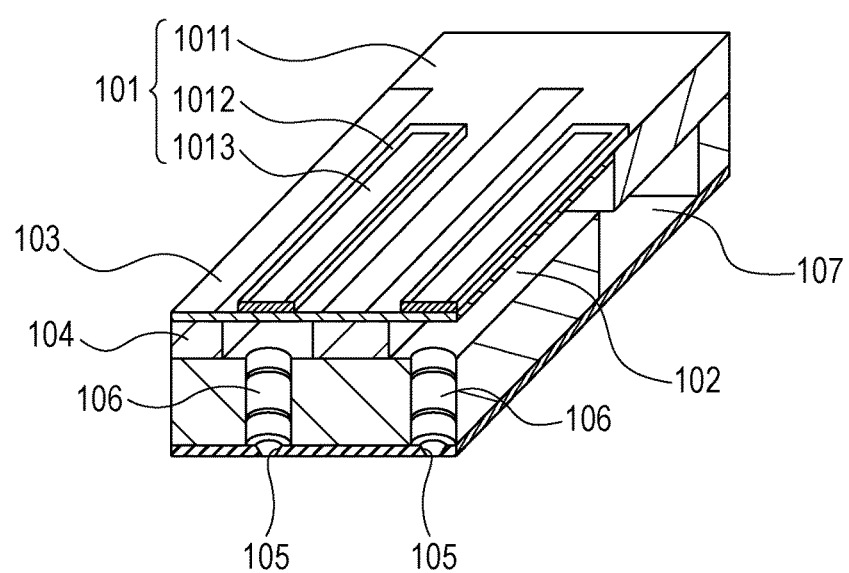
FIG. 6B is a schematic view showing a structure of a liquid discharge head according to an embodiment of the present invention.

FIGS. 6A and 6B are schematic views showing a structure of a liquid discharge head according to an embodiment of the present invention. As shown in FIGS. 6A and 6B, the liquid discharge head of the present invention includes a piezoelectric element 101. The piezoelectric element 101 includes at least a first electrode 1011, a piezoelectric ceramic 1012, and a second electrode 1013. The piezoelectric ceramic 1012 is patterned as shown in FIG. 6B when necessary.

FIG. 6B is a schematic view of the liquid discharge head. The liquid discharge head includes ejection ports 105, individual liquid chambers 102, connecting holes 106 that connect the individual liquid chambers 102 to the ejection ports 105, liquid chamber partition walls 104, a common liquid chamber 107, a diaphragm 103, and the piezoelectric element 101. Although the piezoelectric element 101 illustrated in the drawing has a rectangular shape, the shape may be any other shape, such as an elliptical shape, a circular shape, or a parallelogram shape. In general, the piezoelectric ceramic 1012 follows the shape of the individual liquid chamber 102.

The piezoelectric element 101 and its nearby portion in the liquid discharge head of the present invention will now be described in detail with reference to FIG. 6A. FIG. 6A is a sectional view of the piezoelectric element shown in FIG. 6B taken in the width direction. Although the sectional shape of the piezoelectric element 101 in the drawing is rectangular, the sectional shape may be a trapezoidal shape or an inverted trapezoidal shape.

In the drawing, the first electrode 1011 is used as a lower electrode and the second electrode 1013 is used as an upper electrode. However, the arrangement of the first electrode 1011 and the second electrode 1013 is not limited thereto. For example, the first electrode 1011 may be used as the lower electrode or the upper electrode. The second electrode 1013 may be used as the upper electrode or the lower electrode. A buffer layer 108 may be present between the diaphragm 103 and the lower electrode. Such differences in naming are derived from the device production method and effects of the present invention can be produced in either case.

The diaphragm 103 of the liquid discharge head moves in vertical directions as the piezoelectric ceramic 1012 expands and contracts, and applies pressure to liquid in the individual liquid chamber 102. As a result, the liquid is discharged from the ejection port 105. The liquid discharge head of the present invention can be used in printers and for production of electronic devices.

The thickness of the diaphragm 103 is 1.0 μm or more and 15 μm or less and preferably 1.5 μm or more and 8 μm or less. The material for forming the diaphragm 103 is not particularly limited, but can be silicon. Silicon constituting the diaphragm 103 may be doped with boron or phosphorus. The buffer layer 108 on the diaphragm 103 and the electrode layer on the buffer layer 108 may constitute part of the diaphragm 103. The thickness of the buffer layer 108 is 5 nm or more and 300 nm or less and preferably 10 nm or more and 200 nm or less. The size of the ejection port 105 is 5 μm or more and 40 μm or less in terms of equivalent circular diameter. The shape of the ejection port 105 may be circular, star-shaped, rectangular, or triangular.

Liquid Discharge Apparatus

A liquid discharge apparatus of the present invention will now be described. The liquid discharge apparatus of the present invention includes a transport unit for recording media and the liquid discharge head described above.

Figure 7:
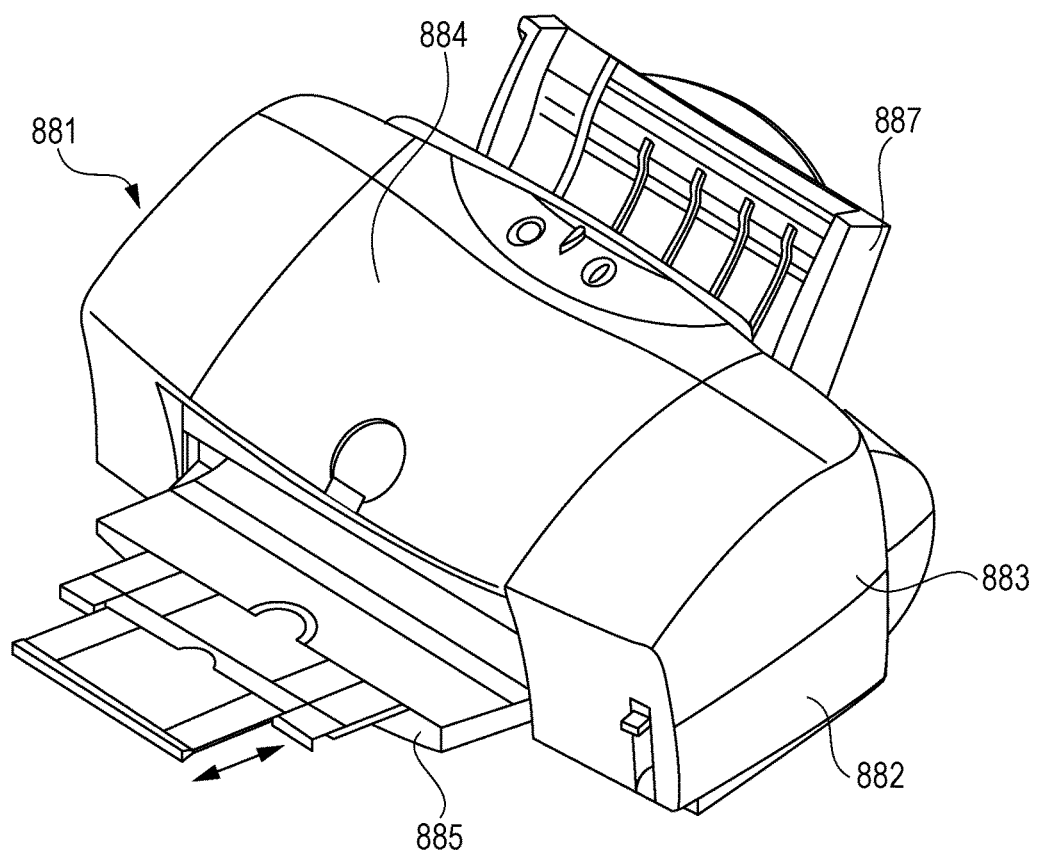
FIG. 7 is a schematic view showing a liquid discharge apparatus according to an embodiment of the present invention.
Figure 8:
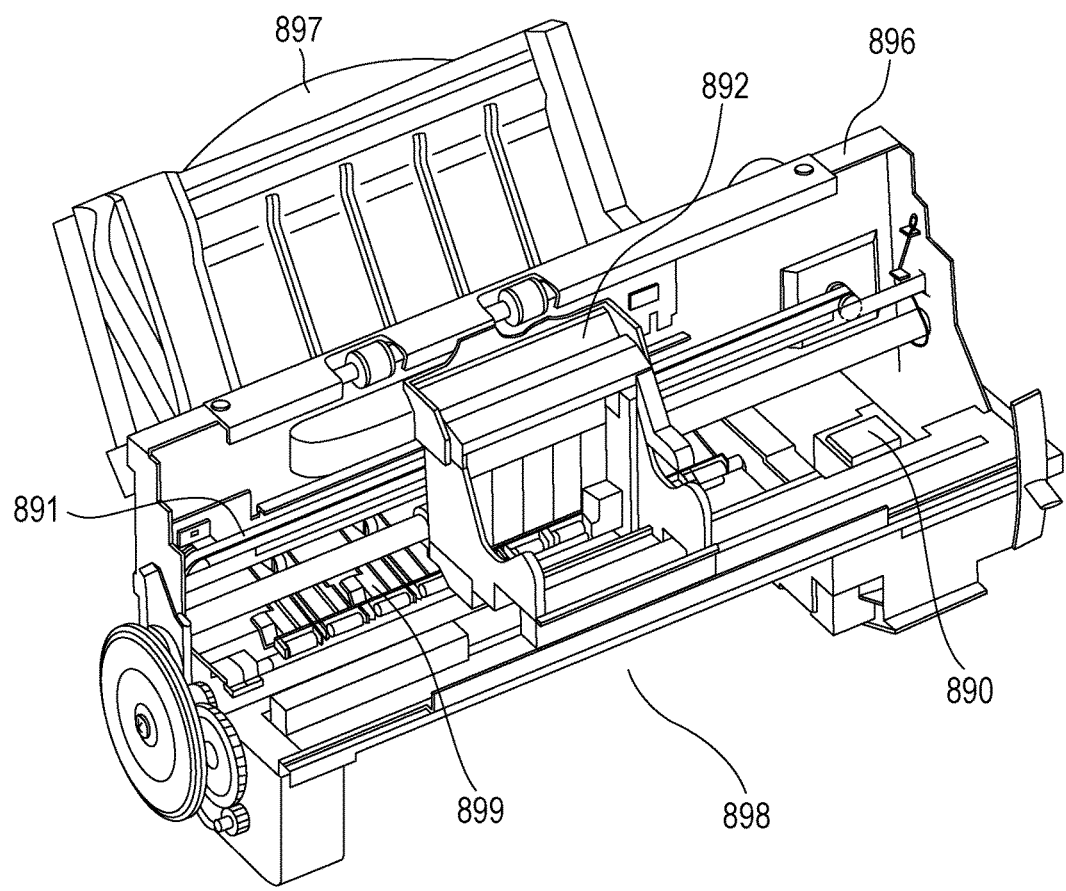
FIG. 8 is a schematic view showing a liquid discharge apparatus according to an embodiment of the present invention.

An example of the liquid discharge apparatus of the present invention is an ink jet recording apparatus shown in FIGS. 7 and 8. FIG. 8 shows the state in which outer casings 882 to 885 and 887 are removed from a liquid discharge apparatus (ink jet recording apparatus) 881 shown in FIG. 7. The ink jet recording apparatus 881 includes an automatic feeding unit 897 configured to automatically feed a recording sheet serving as a recording medium into a main body 896. The ink jet recording apparatus 881 also includes a transport unit 899 that guides the recording sheet fed from the automatic feeding unit 897 to a particular recording position and to an ejection slot 898 from the recording position, a recording unit 891 configured to conduct recording on the recording sheet transferred to the recording position, and a recovery unit 890 configured to conduct a recovery process on the recording unit 891. The recording unit 891 has a carriage 892 that houses the liquid discharge head of the present invention and moves on a rail in a reciprocating manner.

When an electric signal is input to this ink jet recording apparatus from a computer, the carriage 892 moves on the rail and a driving voltage is applied to the electrodes sandwiching the piezoelectric ceramic so that the piezoelectric ceramic undergoes deformation. This deformation of the piezoelectric ceramic pressurizes the individual liquid chamber 102 via the diaphragm 103 shown in FIG. 6B and causes ink to be discharged from the ejection port 105, thereby conducting printing.

The liquid discharge apparatus of the present invention can discharge liquid uniformly at a high speed and can be downsized.

Although an example of a printer is described above, the liquid discharge apparatus of the present invention may be used as industrial liquid discharge apparatuses and liquid discharge apparatuses configured to form images on media, in addition to ink jet recording apparatuses such as facsimile machines, multifunction apparatuses, and copying machines.

Ultrasonic Motor

An ultrasonic motor according to the present invention includes at least a vibration body equipped with the piezoelectric element or multilayered piezoelectric element and a rotor that contacts the vibration body.

Figure 9A:
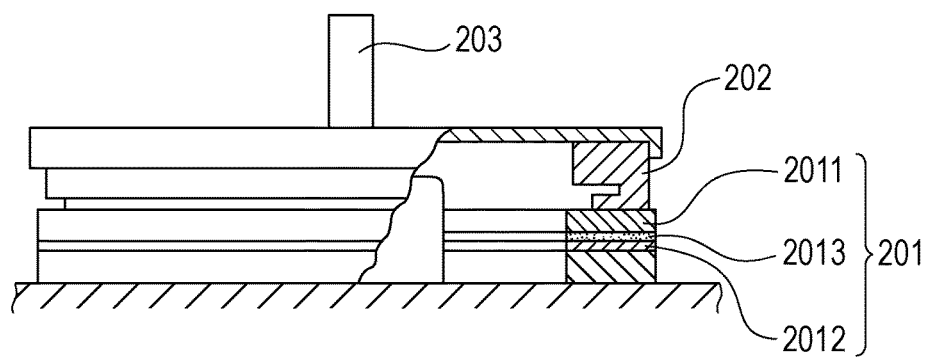
FIG. 9A is a schematic view showing a structure of an ultrasonic motor according to an embodiment of the present invention.
Figure 9B:
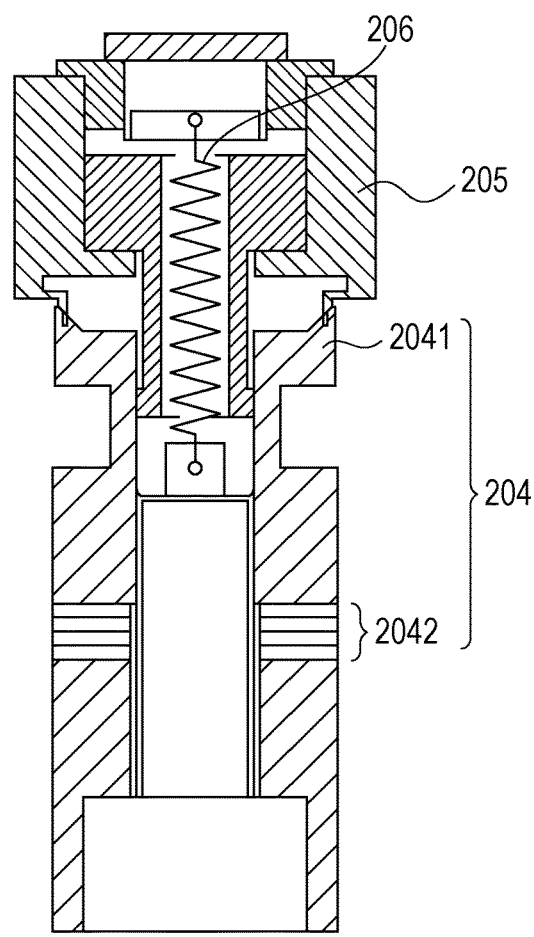
FIG. 9B is a schematic view showing a structure of an ultrasonic motor according to an embodiment of the present invention.

FIGS. 9A and 9B are schematic views each showing a structure of an ultrasonic motor according to an embodiment of the present invention. FIG. 9A shows an ultrasonic motor that includes a piezoelectric element having a single-layer structure. The ultrasonic motor includes an oscillator 201, a rotor 202 pressure-contacting a sliding surface of the oscillator 201 due to the pressing force from a pressing spring (not shown), and an output shaft 203 integral with the rotor 202. The oscillator 201 is constituted by, for example, a metal elastic ring 2011, a piezoelectric element 2012 of the present invention, and an organic adhesive 2013 (e.g., epoxy-based or cyanoacrylate-based adhesive) that bonds the piezoelectric element 2012 to the elastic ring 2011. The piezoelectric element 2012 of the present invention is composed of a piezoelectric ceramic sandwiched between a first electrode and a second electrode which are not shown in the drawing.

When two phases of AC voltage that are different from each other by the product of $\pi/4$ multiplied by an odd number are applied to the piezoelectric element 2012 of the present invention, a bending traveling wave is generated in the oscillator 201 and each of the points on the sliding surface of the oscillator 201 undergoes elliptic motion. When the rotor 202 is in pressure-contact with the sliding surface of the oscillator 201, the rotor 202 receives frictional force from the oscillator 201 and rotates in a direction opposite to that of the bending travelling wave. An object to be driven, which is not shown in the drawing, is joined to the output shaft 203 and is driven by the rotational force of the rotor 202.

When voltage is applied to the piezoelectric ceramic, the piezoelectric ceramic expands and contracts due to the transverse piezoelectric effect. When an elastic member such as a metal member is in contact with the piezoelectric element, the elastic member is bent as the piezoelectric ceramic expands and contracts. The ultrasonic motor described herein is of a type that operates on this principle.

FIG. 9B shows an example of an ultrasonic motor including a multilayered piezoelectric element. An oscillator 204 includes a cylindrical metal elastic member 2041 and a multilayered piezoelectric element 2042 provided in the metal elastic member 2041. The multilayered piezoelectric element 2042 is constituted by stacking a plurality of piezoelectric ceramics (not shown). A first electrode and a second electrode are disposed on outer surfaces of the multilayered body and internal electrodes are provided inside the multilayered body. The metal elastic member 2041 is bolted to clamp the multilayered piezoelectric element 2042, which constitutes the oscillator 204.

Application of different phases of AC voltage to the multilayered piezoelectric element 2042 causes the oscillator 204 to excite two oscillations orthogonal to each other. These two oscillations are combined into a circular oscillation that drives the tip of the oscillator 204. An annular groove is formed in the upper part of the oscillator 204 to increase the displacement of the oscillation for drive.

A rotor 205 is in pressure-contact with the oscillator 204 due to a pressing spring 206 and receives frictional force for drive. The rotor 205 is rotatably supported on bearings.

Optical Apparatus

An optical apparatus of the present invention will now be described. The optical apparatus of the present invention includes the above-described ultrasonic motor in a drive unit.

Figure 10A:
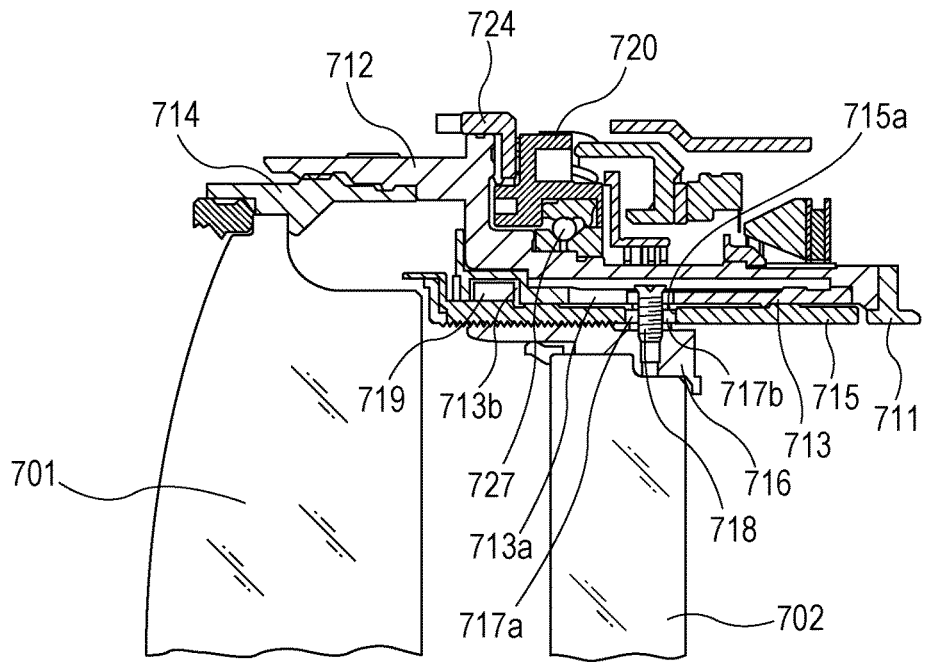
FIG. 10A is a schematic view showing an optical apparatus according to an embodiment of the present invention.
Figure 10B:
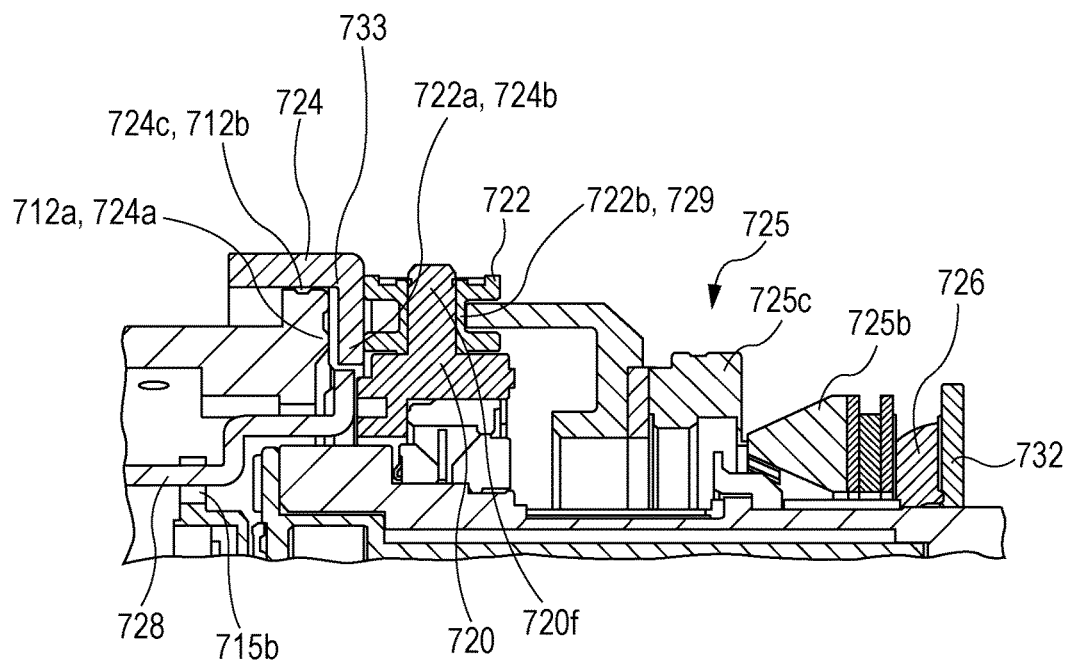
FIG. 10B is a schematic view showing an optical apparatus according to an embodiment of the present invention.
Figure 11:
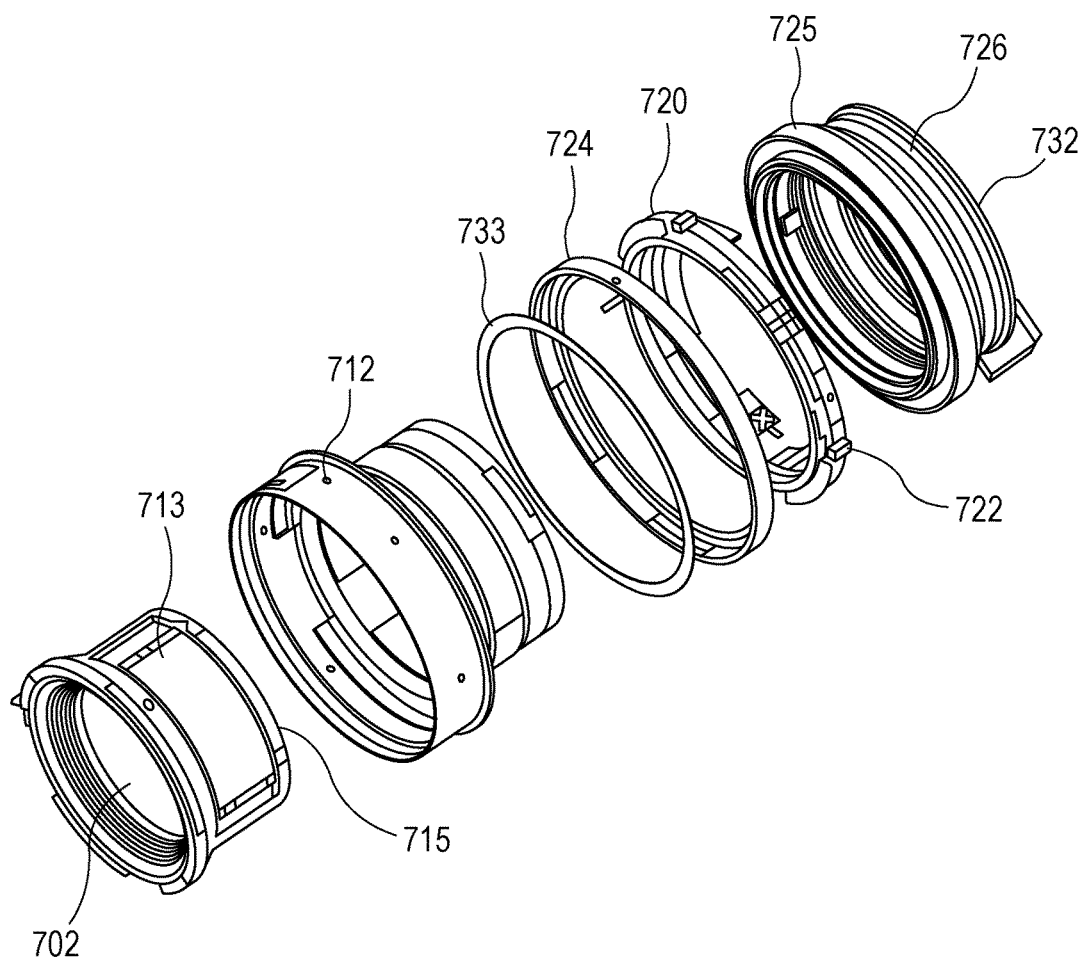
FIG. 11 is a schematic view showing an optical apparatus according to an embodiment of the present invention.

FIGS. 10A and 10B are each a sectional view of a related part of a replaceable lens barrel of a single-lens reflex camera, which is an example of an image pickup apparatus according to an embodiment of the present invention. FIG. 11 is an exploded perspective view of the replaceable lens barrel. A fixed barrel 712, a linear guide barrel 713, and a front lens group barrel 714 are fixed to a mount 711 detachable from and attachable to a camera. These are fixed members of the replaceable lens barrel.

A linear guide groove 713a extending in an optical axis direction is formed in the linear guide barrel 713 to guide a focus lens 702. A cam roller 717a and a cam roller 717b protruding in an outer radial direction are fixed with a shaft screw 718 to a rear lens group barrel 716 holding the focus lens 702. The cam roller 717a is fitted in the linear guide groove 713a.

A cam ring 715 is rotatably fitted to the inner periphery of the linear guide barrel 713. Relative movements between the linear guide barrel 713 and the cam ring 715 in the optical axis direction is inhibited because a roller 719 fixed to the cam ring 715 is fitted in an annular groove 713b of the linear guide barrel 713. A cam groove 715a for the focus lens 702 is formed in the cam ring 715. The cam roller 717b is fitted in the cam groove 715a.

A rotation transmitting ring 720 is provided on the outer peripheral side of the fixed barrel 712. The rotation transmitting ring 720 is held by a ball race 727 so that it can rotate at a particular position relative to the fixed barrel 712. A roller 722 is rotatably held on the rotation transmitting ring 720 by a shaft 720f extending in a radial manner from the rotation transmitting ring 720, and a large-diameter portion 722a of the roller 722 is in contact with a mount-side end surface 724b of a manual focus ring 724. A small-diameter portion 722b of the roller 722 is in contact with a joint member 729. Six equally spaced rollers 722 are arranged on the outer periphery of the rotation transmitting ring 720 and each roller is configured to have the above-described relationship.

A low-friction sheet (washer member) 733 is arranged on the inner radial portion of the manual focus ring 724. The low-friction sheet 733 is interposed between a mount-side end surface 712a of the fixed barrel 712 and a front-side end surface 724a of the manual focus ring 724. The outer radial surface of the low-friction sheet 733 has a ring shape and is fitted in an inner radial portion 724c of the manual focus ring 724. The inner radial portion 724c of the manual focus ring 724 is fitted in an outer radial portion 712b of the fixed barrel 712. The low-friction sheet 733 reduces the friction in a rotary ring mechanism in which the manual focus ring 724 is rotated relative to the fixed barrel 712 about the optical axis.

The large-diameter portion 722a of the roller 722 and a mount-side end surface 724b of the manual focus ring 724 contact each other under pressure by being pressed by a wave washer 726 that presses an ultrasonic motor 725 toward the front side of the lens. The force from the wave washer 726 pressing the ultrasonic motor 725 toward the front side of the lens also causes the small-diameter portion 722b of the roller 722 and the joint member 729 to contact each other under an adequate degree of pressure. The wave washer 726 is confined from moving in the mount direction by a washer 732 bayonet-mounted to the fixed barrel 712. The spring force (urging force) generated by the wave washer 726 is transmitted to the ultrasonic motor 725 and to the roller 722 and serves as thrusting force of the manual focus ring 724 against the mount-side end surface 712a of the fixed barrel 712. In other words, the manual focus ring 724 is assembled while being pressed against the mount-side end surface 712a of the fixed barrel 712 via the low-friction sheet 733. Accordingly, when the ultrasonic motor 725 is driven and rotated with respect to the fixed barrel 712 by a controlling unit (not shown), the roller 722 rotates about the center of the shaft 720f because the joint member 729 makes frictional contact with the small-diameter portion 722b of the roller 722. As the roller 722 rotates about the shaft 720f, the rotation transmitting ring 720 is rotated about the optical axis (automatic focusing operation).

When rotation force about the optical axis is applied to the manual focus ring 724 from a manual operation input unit (not shown), the roller 722 rotates about the shaft 720f due to the frictional force because the mount-side end surface 724b of the manual focus ring 724 is in pressure-contact with the large-diameter portion 722a of the roller 722. As the large-diameter portion 722a of the roller 722 rotates about the shaft 720f, the rotation transmitting ring 720 is rotated about the optical axis. The ultrasonic motor 725 at this time is prevented from rotating due to the frictional retention force of a rotor 725c and a stator 725b (manual focusing operation).

Two focus keys 728 are installed in the rotation transmitting ring 720 at positions opposite to each other and fitted in notches 715b at the front tip of the cam ring 715. When automatic focusing operation or manual focusing operation is conducted and the rotation transmitting ring 720 is rotated about the optical axis, the rotation force is transmitted to the cam ring 715 via the focus keys 728. When the cam ring 715 is rotated about the optical axis, the rear lens group barrel 716 inhibited from rotating due to the cam roller 717a and the linear guide groove 713a moves back and forth along the cam groove 715a in the cam ring 715 by the cam roller 717b. This drives the focus lens 702 and focusing operation is conducted.

Although a replaceable lens barrel of a single-lens reflex camera has been described as an example of the optical apparatus of the present invention, the range of the optical apparatus is not limited thereto. The optical apparatus may be any type of camera such as a compact camera or an electronic still camera or may be an optical apparatus having an ultrasonic motor in a drive unit.

Vibrating Device and Dust Removing Device

A vibrating device used to transport or remove particles, powder, or liquid is widely used in electronic apparatuses. A dust removing device that uses the piezoelectric element of the present invention will now be described as an example of a vibrating device of the present invention.

The dust removing device of the present invention includes at least a vibration body equipped with the piezoelectric element or multilayered piezoelectric element described above.

Figure 12A:
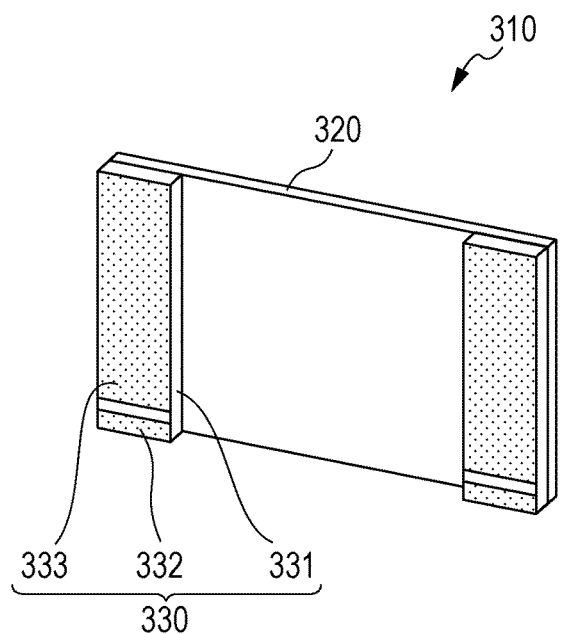
FIG. 12A is a schematic view showing an embodiment in the case where a vibrating device of the present invention is used as a dust removing device.
Figure 12B:
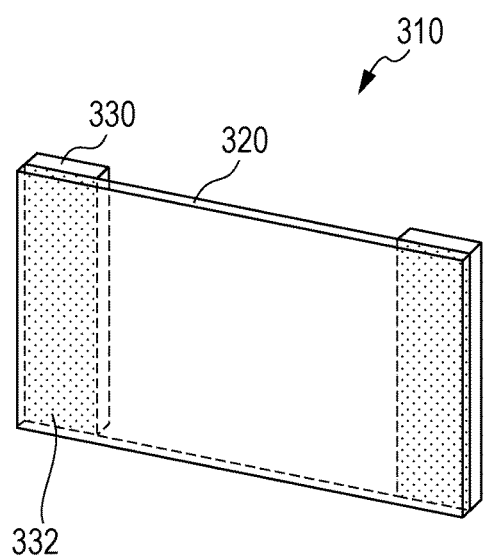
FIG. 12B is a schematic view showing an embodiment in the case where a vibrating device of the present invention is used as a dust removing device.

FIGS. 12A and 12B are schematic views showing a dust removing device according to an embodiment of the present invention. A dust removing device 310 includes a plate-shaped piezoelectric element 330 and a diaphragm 320. The piezoelectric element 330 may be the multilayered piezoelectric element of the present invention. Although the material of the diaphragm 320 is not limited, a transparent material or a light-reflecting material may be used in the diaphragm 320 when the dust removing device 310 is to be used in optical devices.

Figure 13A:
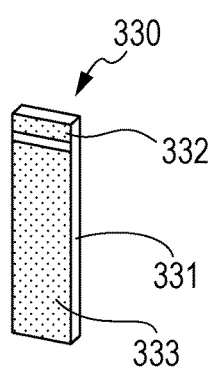
FIG. 13A is a schematic view showing a structure of a piezoelectric element in the dust removing device of the present invention.
Figure 13B:
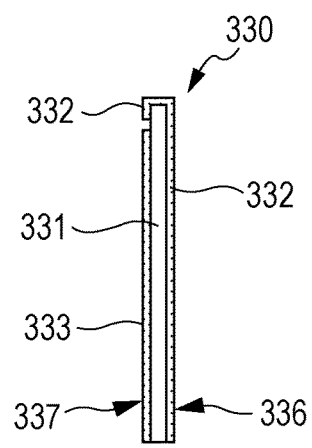
FIG. 13B is a schematic view showing a structure of a piezoelectric element in the dust removing device of the present invention.
Figure 13C:
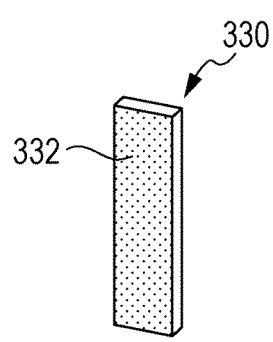
FIG. 13C is a schematic view showing a structure of a piezoelectric element in the dust removing device of the present invention.

FIGS. 13A to 13C are each a schematic view showing a structure of the piezoelectric element 330 in FIGS. 12A and 12B. FIG. 13A shows a structure of the front surface of the piezoelectric element 330. FIG. 13B shows a structure of the side surface of the piezoelectric element 330. FIG. 13C shows a structure of the rear surface of the piezoelectric element 330. As shown in FIGS. 12A and 12B, the piezoelectric element 330 includes a piezoelectric ceramic 331, a first electrode 332, and a second electrode 333, and the first electrode 332 and the second electrode 333 are disposed so as to face each other with the piezoelectric ceramic 331 sandwiched therebetween. The piezoelectric element 330 may be the multilayered piezoelectric element of the present invention as in the case of FIGS. 12A and 12B. In this case, the piezoelectric ceramic 331 has a structure in which piezoelectric ceramic layers and internal electrodes are alternately stacked and the internal electrodes and the first electrode 332 or the second electrode 333 are short-circuited in an alternating manner. Thus, the piezoelectric ceramic layers have driving waveforms with different phases. A surface of the piezoelectric element 330 on which the first electrode 332 is disposed in FIG. 13C is referred to as a first electrode surface 336. A surface of the piezoelectric element 330 on which the second electrode 333 is disposed in FIG. 13A is referred to as a second electrode surface 337.

The electrode surface in the present invention is a surface of a piezoelectric element on which an electrode is disposed. As shown in FIGS. 13A to 13C, for example, the first electrode 332 may extend to the second electrode surface 337.

As shown in FIGS. 12A and 12B, the piezoelectric element 330 is fixed to the diaphragm 320 so that the first electrode surface 336 of the piezoelectric element 330 and the plate surface of the diaphragm 320 face each other. The driving of the piezoelectric element 330 generates stress between the piezoelectric element 330 and the diaphragm 320, which generates out-of-plane oscillation in the diaphragm 320. The dust removing device 310 of the present invention is a device that removes foreign matter such as dust attached to the surface of the diaphragm 320 by causing out-of-plane oscillation of the diaphragm 320. Out-of-plane oscillation means elastic oscillation in which a diaphragm is displaced in an optical axis direction, that is, in a thickness direction of the diaphragm.

Figure 14A:
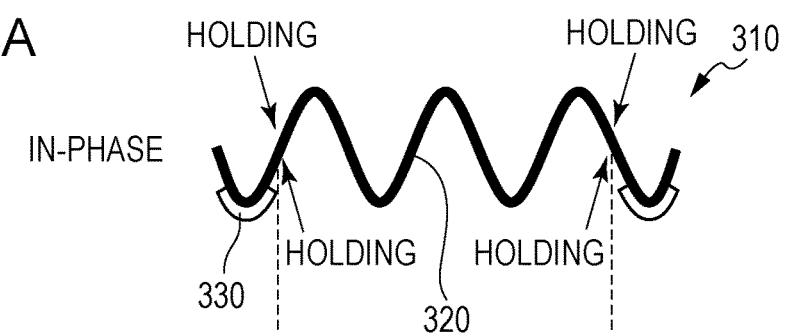
FIG. 14A is a schematic view showing the oscillation principle of the dust removing device of the present invention.
Figure 14B:
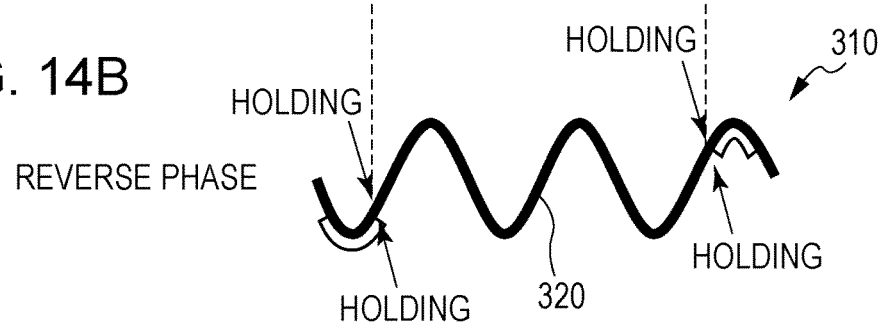
FIG. 14B is a schematic view showing the oscillation principle of the dust removing device of the present invention.

FIGS. 14A and 14B are schematic views showing the oscillation principle of the dust removing device 310 of the present invention. FIG. 14A shows the state in which out-of-plane oscillation is generated in the diaphragm 320 by applying an in-phase alternating electric field to a left-and-right pair of piezoelectric elements 330. The polarization direction of the piezoelectric ceramic that constitutes each of the left-and-right pair of piezoelectric elements 330 is the same as the thickness direction of the piezoelectric element 330, and the dust removing device 310 is driven with a seventh oscillation mode. FIG. 14B shows the state in which out-of-plane oscillation is generated in the diaphragm 320 by applying a reverse phase alternating voltage with a 180-degree opposite phase to a left-and-right pair of piezoelectric elements 330. The dust removing device 310 is driven with a sixth oscillation mode. The dust removing device 310 of the present invention is a device that can effectively remove dust attached to the surface of the diaphragm by using at least two different vibration modes.

Image Pickup Apparatus

Figure 15:
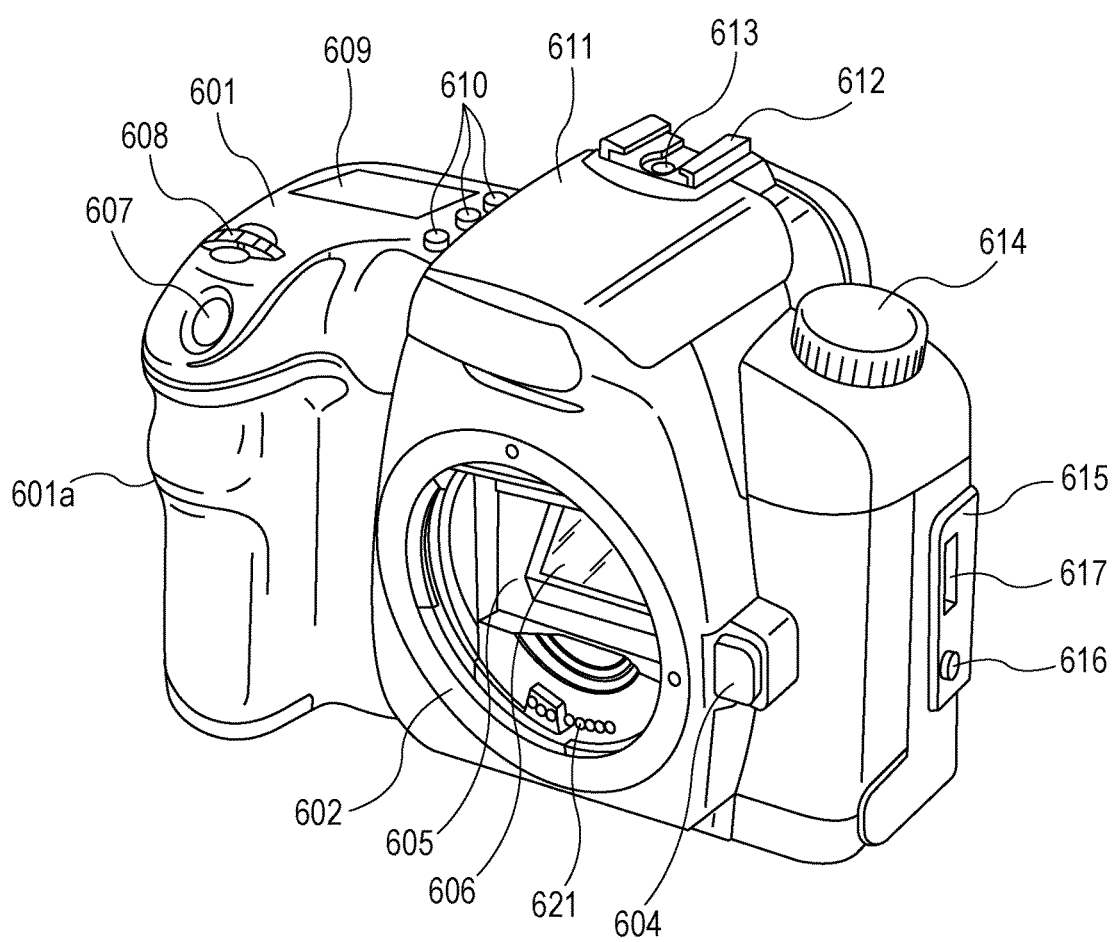
FIG. 15 is a schematic view showing an image pickup apparatus according to an embodiment of the present invention.
Figure 16:
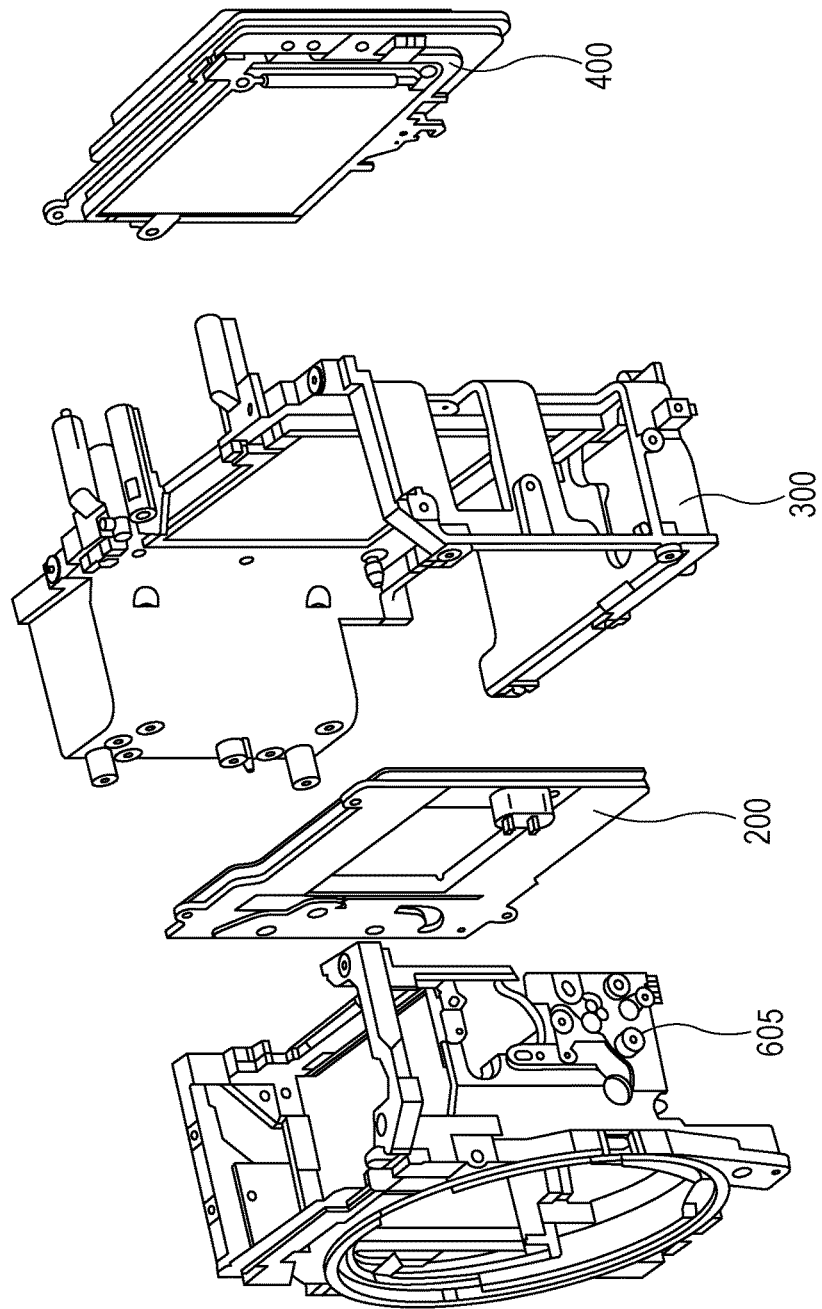
FIG. 16 is a schematic view showing an image pickup apparatus according to an embodiment of the present invention.

An image pickup apparatus of the present invention will now be described. The image pickup apparatus of the present invention includes at least the dust removing device and an image pickup element unit, and the vibration body of the dust removing device is disposed on the light-receiving-surface side of the image pickup element unit. FIGS. 15 and 16 show a digital single-lens reflex camera, which is an example of an image pickup apparatus according to an embodiment of the present invention.

FIG. 15 is a front perspective view of a camera body 601 viewed from the subject side. In FIG. 15, an image pickup lens unit is removed. FIG. 16 is an exploded perspective view schematically showing the inside structure of a camera for describing a structure around the dust removing device of the present invention and an image pickup unit 400.

A mirror box 605 into which photographing light beams that have passed through the image pickup lens are guided is disposed inside the camera body 601. A min mirror (quick return mirror) 606 is disposed inside the mirror box 605. The main mirror 606 can take a state in which the main mirror 606 is held at an angle of 45° with respect to a photographing optical axis for the purpose of guiding the photographing light beams towards the penta-dach-mirror (not shown) and a state in which the main mirror 606 is held at a position at which the main mirror 606 is evacuated from the photographing light beams for the purpose of guiding the photographing light beams towards an image pickup element (not shown).

The mirror box 605 and a shutter unit 200 are disposed on the subject side of a body chassis 300 serving as the skeleton of the camera body. The mirror box 605 and the shutter unit 200 are disposed in that order from the subject side. An image pickup unit 400 is disposed on the photographer side of the body chassis 300. The image pickup unit 400 is installed to a mounting face of a mount portion 602 serving as the base for attaching the image pickup lens unit so that the image pickup face of the image pickup element is arranged in parallel with the mounting face with a predetermined distance therebetween.

Herein, a digital single-lens reflex camera has been described as the image pickup apparatus of the present invention. The image pickup apparatus may be, for example, an image pickup lens unit-replaceable camera such as a digital single-lens mirrorless camera not having the mirror box 605. The present invention can also be applied to any apparatus required to remove dust attached to the surface of an optical part among various image pickup apparatuses such as image pickup lens unit-replaceable video cameras, copiers, facsimile machines, and scanners and electrical and electronic apparatuses including image pickup apparatuses.

Electronic Apparatus

An electronic apparatus of the present invention will now be described. The electronic apparatus of the present invention includes a piezoelectric acoustic component equipped with the piezoelectric element or multilayered piezoelectric element described above. The piezoelectric acoustic component may be a speaker, a buzzer, a microphone, or a surface acoustic wave (SAW) device.

Figure 17:
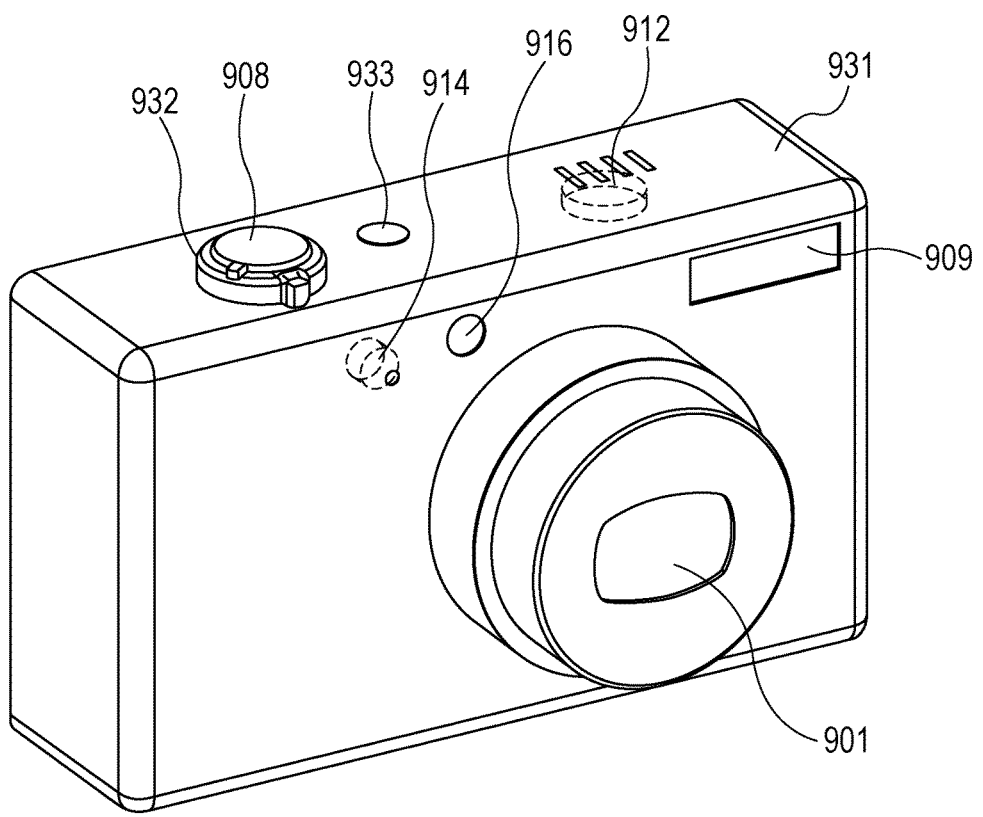
FIG. 17 is a schematic view showing an electronic apparatus according to an embodiment of the present invention.

FIG. 17 is a perspective view of a digital camera, which is an example of the electronic apparatus according to an embodiment of the present invention, as viewed from the front of a main body 931 of the digital camera. An optical device 901, a microphone 914, a strobe light unit 909, and an auxiliary light unit 916 are installed in the front face of the main body 931. Since the microphone 914 is assembled inside the main body 931, it is indicated by a broken line. A hole for collecting sound from outside is formed at the front of the microphone 914.

A power button 933, a speaker 912, a zoom lever 932, and a release button 908 for executing focusing operation are installed in the upper surface of the main body 931. The speaker 912 is built inside the main body 931 and is indicated by a broken line. Holes for outputting sound are formed at the front of the speaker 912.

The piezoelectric acoustic component of the present invention is used in at least one of the microphone 914, the speaker 912, and a SAW device.

Although a digital camera has been described as one example of the electronic apparatus of the present invention, the electronic apparatus is not limited thereto and may be any electronic apparatus equipped with a piezoelectric acoustic component, such as a sound-reproducing apparatus, a sound-recording apparatus, a cellular phone, and an information terminal.

As described above, the piezoelectric element and multilayered piezoelectric element of the present invention are suitable for use in a liquid discharge head, a liquid discharge apparatus, an ultrasonic motor, an optical apparatus, a vibrating device, a dust removing device, an image pickup apparatus, and an electronic apparatus.

When the lead-free piezoelectric ceramic of the present invention is used, a liquid discharge head that has a nozzle density and discharge velocity equal to or higher than those of a liquid discharge head that includes a lead-containing piezoelectric ceramic can be provided.

When the lead-free piezoelectric ceramic of the present invention is used, a liquid discharge apparatus that has a discharge velocity and discharge accuracy equal to or higher than those of a liquid discharge apparatus that includes a lead-containing piezoelectric ceramic can be provided.

When the lead-free piezoelectric ceramic of the present invention is used, an ultrasonic motor that has a driving force and durability equal to or higher than those of an ultrasonic motor that includes a lead-containing piezoelectric ceramic can be provided.

When the lead-free piezoelectric ceramic of the present invention is used, an optical apparatus that has durability and operation accuracy equal to or higher than those of an optical apparatus that includes a lead-containing piezoelectric ceramic can be provided.

When the lead-free piezoelectric ceramic of the present invention is used, a vibrating device that has vibration performance and durability equal to or higher than those of a vibrating device that includes a lead-containing piezoelectric ceramic can be provided.

When the lead-free piezoelectric ceramic of the present invention is used, a dust removing device that has a dust removing efficiency and durability equal to or higher than those of a dust removing device that includes a lead-containing piezoelectric ceramic can be provided.

When the lead-free piezoelectric ceramic of the present invention is used, an image pickup apparatus that has a dust removing function equal to or higher than that of an image pickup apparatus that includes a lead-containing piezoelectric ceramic can be provided.

When a piezoelectric acoustic component equipped with the lead-free piezoelectric ceramic of the present invention is used, an electronic apparatus that has a sound-generating property equal to or better than that of an electronic apparatus that includes a lead-containing piezoelectric ceramic can be provided.

The piezoelectric ceramic of the present invention can be used not only in liquid discharge heads and motors but also in devices such as ultrasonic oscillators, piezoelectric actuators, piezoelectric sensors, and ferroelectric memories.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-093069, filed Apr. 16, 2012, which is hereby incorporated by reference herein in its entirety.

INDUSTRIAL APPLICABILITY

The method for producing a ceramic according to the present invention can be applied to various ceramics. In particular, a lead-free piezoelectric ceramic provides a low load on the environment and generates good piezoelectricity. The ceramic produced in the present invention can be used in apparatuses that use a large amount of ceramic having a piezoelectric property, such as a liquid discharge head, an ultrasonic motor, a dust removing device, and an electronic apparatus equipped with a piezoelectric acoustic component.

The invention claimed is:

1. A sodium niobate powder comprising sodium niobate cuboidal particles having a shape of a cuboid and having a side average length of 0.1 µm or more and 100 µm or less,
    wherein at least one face of each of the sodium niobate cuboidal particles is a (100) plane in the pseudocubic notation, and
    an amount of physically adsorbed water and constitution water of the sodium niobate powder is 0.15 mass % or less.

2. The sodium niobate powder according to claim 1, wherein the sodium niobate cuboidal particles are represented by general formula (1) below:

$$Na_{1+x}NbO_{3+x/2} (-0.1 \leq x \leq 0.1).$$ General formula (1)

3. The sodium niobate powder according to claim 1, wherein the ratio $L_{max}/L_{min}$ of a maximum side length $L_{max}$ to a minimum side length $L_{min}$ of the sodium niobate cuboidal particles is 3 or less.

4. A method for producing a sodium niobate powder, the method at least comprising:
    a step of holding an aqueous alkali dispersion liquid containing an amorphous niobium oxide hydrate at a pressure exceeding 0.1 MPa and at 141° C. to 260° C. for 1 to 100 hours;
    a step of isolating a solid matter from the aqueous dispersion liquid after the holding; and
    a step of heat treating the solid matter at 500° C. or more and 700° C. or less to obtain the sodium niobate powder, wherein
    the sodium niobate powder comprises sodium niobate cuboidal particles having a shape of a cuboid and having a side average length of 0.1 µm or more and 100 µm or less,
    at least one face of each of the sodium niobate cuboidal particles is a (100) plane in a pseudocubic notation, and
    an amount of physically adsorbed water and constitution water of the sodium niobate powder is 0.15 mass % or less.

5. A method for producing a ceramic, the method comprising:
    a step of obtaining a compact by molding a raw material powder containing the sodium niobate powder according to claim 1; and
    a step of sintering the compact.

6. The method according to claim 5, wherein the step of obtaining the compact includes a substep of performing sheet forming on a slurry containing the sodium niobate powder to obtain a green sheet and a substep of stacking the green sheet to obtain a compact.

7. A ceramic produced using the method for producing a ceramic according to claim 5.

8. A piezoelectric element at least comprising:
    a ceramic having a piezoelectric property;
    a first electrode; and
    a second electrode,
    wherein the ceramic is the ceramic according to claim 7.

9. A multilayered piezoelectric element comprising:
    a ceramic layer having a piezoelectric property; and
    an electrode layer including an internal electrode,
    wherein the ceramic layer and the electrode layer are alternately stacked, and
    the ceramic layer is composed of the ceramic according to claim 7.

10. The multilayered piezoelectric element according to claim 9, wherein the internal electrode contains Ag and Pd and the weight ratio M1/M2 of a Ag content M1 to a Pd content M2 satisfies 0.25≤M1/M2≤8.0.

11. The multilayered piezoelectric element according to claim 9, wherein the internal electrode contains at least one of Ni and Cu.

12. A liquid discharge head at least comprising:
a liquid chamber equipped with a vibrating unit that includes the piezoelectric element according to claim 8; and
an ejection port in communication with the liquid chamber.

13. A liquid discharge apparatus comprising:
a transport unit for recording media; and
the liquid discharge head according to claim 12.

14. An ultrasonic motor at least comprising:
a vibration body that includes the piezoelectric element according to claim 8; and
a rotor that contacts the vibration body.

15. An optical apparatus comprising the ultrasonic motor according to claim 14 in a drive unit.

16. A vibrating device comprising a vibration body that includes the piezoelectric element according to claim 8.

17. A dust removing device comprising the vibrating device according to claim 16.

18. An image pickup apparatus at least comprising:
the dust removing device according to claim 17; and
an image pickup element unit,
wherein the vibration body of the dust removing device is disposed on a light-receiving-surface side of the image pickup element unit.

19. An electronic apparatus comprising a piezoelectric acoustic component that includes the piezoelectric element according to claim 8.

20. The sodium niobate powder according to claim 1, wherein the amount of physically adsorbed water and constitution water is measured using a thermal desorption spectroscopy (TDS).

21. A liquid discharge head at least comprising:
a liquid chamber equipped with a vibrating unit that includes the multilayered piezoelectric element according to claim 9; and
an ejection port in communication with the liquid chamber.

22. A liquid discharge apparatus comprising:
a transport unit for recording media; and
the liquid discharge head according to claim 21.

23. An ultrasonic motor at least comprising:
a vibration body that includes the multilayered piezoelectric element according to claim 9; and
a rotor that contacts the vibration body.

24. An optical apparatus comprising the ultrasonic motor according to claim 23 in a drive unit.

25. A vibrating device comprising a vibration body that includes the multilayered piezoelectric element according to claim 9.

26. A dust removing device comprising the vibrating device according to claim 25.

27. An image pickup apparatus at least comprising:
the dust removing device according to claim 26; and
an image pickup element unit,
wherein the vibration body of the dust removing device is disposed on a light-receiving-surface side of the image pickup element unit.

28. An electronic apparatus comprising a piezoelectric acoustic component that includes the multilayered piezoelectric element according to claim 9.

* * * * *